United States Patent
Manohar et al.

(10) Patent No.: US 9,720,769 B2
(45) Date of Patent: Aug. 1, 2017

(54) STORAGE PARAMETERS FOR A DATA STORAGE DEVICE

(71) Applicant: SANDISK TECHNOLOGIES INC., Plano, TX (US)

(72) Inventors: Abhijeet Manohar, Bangalore (IN); Daniel Edward Tuers, Kapaa, HI (US); Dana Lee, Saratoga, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 113 days.

(21) Appl. No.: 14/659,404

(22) Filed: Mar. 16, 2015

(65) Prior Publication Data

US 2016/0162353 A1    Jun. 9, 2016

Related U.S. Application Data

(60) Provisional application No. 62/087,135, filed on Dec. 3, 2014.

(30) Foreign Application Priority Data

Dec. 8, 2014   (IN) ............................ 6183/CHE/2014

(51) Int. Cl.
*H03M 13/43*  (2006.01)
*G06F 11/10*  (2006.01)
*H03M 13/27*  (2006.01)
*H03M 13/35*  (2006.01)
*H03M 13/11*  (2006.01)
*H03M 13/15*  (2006.01)
*H03M 13/29*  (2006.01)

(52) U.S. Cl.
CPC ......... *G06F 11/1048* (2013.01); *H03M 13/27* (2013.01); *H03M 13/353* (2013.01); *H03M 13/1102* (2013.01); *H03M 13/152* (2013.01); *H03M 13/1515* (2013.01); *H03M 13/2957* (2013.01)

(58) Field of Classification Search
CPC ..................................................... H03M 13/43
USPC .................... 714/760, 764, 799, 785, 763
See application file for complete search history.

(56) References Cited

U.S. PATENT DOCUMENTS

| | | | |
|---|---|---|---|
| 6,483,745 B2 | 11/2002 | Saeki | |
| 6,597,363 B1 * | 7/2003 | Duluk, Jr. ............ | G06T 15/005 345/506 |
| 7,013,378 B2 | 3/2006 | Motta et al. | |
| 7,050,344 B1 | 5/2006 | Cho et al. | |
| 7,197,593 B2 | 3/2007 | Fukuhisa et al. | |
| 7,263,650 B2 | 8/2007 | Keeler et al. | |
| 8,321,765 B2 | 11/2012 | Lee et al. | |

(Continued)

*Primary Examiner* — Fritz Alphonse
(74) *Attorney, Agent, or Firm* — Toler Law Group, PC

(57) ABSTRACT

A method of operating a data storage device having a memory includes reading error location data associated with a first region of the memory. The memory includes the first region and a second region. The method also includes generating one or more parameters based on the error location data. The method includes receiving data to be written to the memory and encoding the data to produce a codeword. The method also includes partitioning the codeword based on the one or more parameters to generate a first portion and a second portion. The method further includes performing a write operation to store the first portion at the first region and to store the second portion at the second region.

34 Claims, 8 Drawing Sheets

(56) References Cited

U.S. PATENT DOCUMENTS

| | | | |
|---|---|---|---|
| 8,902,532 B2 | 12/2014 | Cudak et al. | |
| 8,930,778 B2 * | 1/2015 | Cohen | G06F 11/2094 |
| | | | 711/165 |
| 9,432,298 B1 * | 8/2016 | Smith | H04L 49/9057 |
| 2007/0025738 A1 * | 2/2007 | Moore | H04B 10/1149 |
| | | | 398/189 |
| 2007/0271494 A1 | 11/2007 | Gorobets | |
| 2009/0070656 A1 * | 3/2009 | Jo | G06F 11/1068 |
| | | | 714/763 |
| 2014/0164878 A1 | 6/2014 | Tam | |

* cited by examiner

STORAGE PARAMETERS FOR A DATA STORAGE DEVICE

CROSS-REFERENCE TO RELATED APPLICATIONS

The present application claims priority from U.S. Provisional Application No. 62/087,135 filed Dec. 3, 2014, and from Indian Application No. 6183/CHE/2014 filed Dec. 8, 2014. The contents of each of these applications are incorporated by reference herein in their entirety.

FIELD OF THE DISCLOSURE

The present disclosure is generally related to storage parameters for a data storage device.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the devices to store and provide rapid access to a large amount of data.

Prior to being included in a data storage device, a memory may be tested to determine a number of errors per segment of the memory, such as a number of physical errors (e.g., faulty columns) per segment. If the number of errors in a segment is greater than a threshold, a portion of the memory (e.g., a block of the memory) that includes the segment may be identified as faulty. The blocks of the memory identified as faulty may reduce a yield of usable blocks of the memory.

SUMMARY

The present disclosure presents embodiments of configuring and operating a data storage device to use regions of a memory that have a particular concentration of error locations, such as a concentration of faulty columns (e.g., faulty bit lines) above a threshold. The data storage device may store information that indicates error locations of the memory, such as error locations identified during testing. Based on the information, the data storage device may identify a region of the memory, such as a physical page of a wordline, that includes a high number of error locations (e.g., greater than or equal to a threshold number of error locations). In response to identifying the high number of error locations, the data storage device may identify the region as unreliable to store encoded data (e.g., a codeword) and may determine one or more parameters that may be applied to the encoded data (e.g., the codeword) to be stored at the region. The one or more parameters may be applied to partition (e.g., divide) the encoded data into multiple portions, such as a first portion and a second portion. The first portion may be stored at the region and the second portion may be stored at a second region, such that a number of error locations of the first region and the second region that correspond to the stored first portion and the stored second portion is less than the threshold (e.g., so that the encoded data is considered to be reliably stored). By storing less than an entirety of the encoded data at the region, the data storage device may use the region for data storage despite the region being considered too unreliable to store an entire codeword.

DETAILED DESCRIPTION

Particular implementations are described with reference to the drawings. In the description, common features are designated by common reference numbers throughout the drawings.

Figure 1:
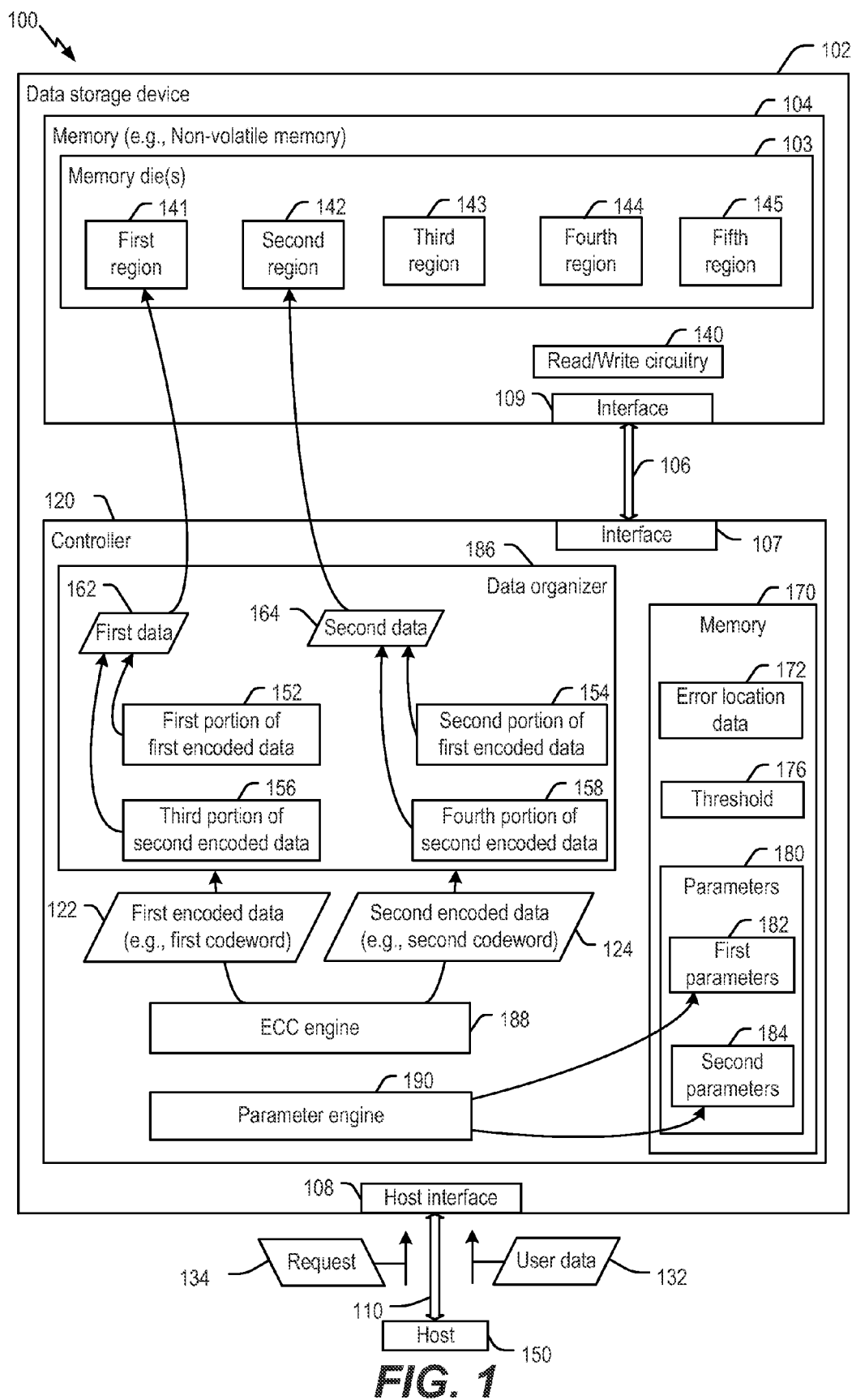
FIG. 1 is a block diagram of a particular illustrative embodiment of a system configured to generate and/or use one or more parameters to stored data at a memory of the data storage device.

Referring to FIG. 1, a particular illustrative embodiment of a system is depicted and generally designated 100. The system 100 includes a data storage device 102 and a host device 150. The data storage device 102 includes a controller 120 and a memory 104, such as a non-volatile memory, that is coupled to the controller 120.

The controller 120 may be configured to identify a region (e.g., one or more physical pages, one or more wordlines, one or more planes, one or more blocks, or a combination thereof) of the memory 104 as having a high number of error locations, such as a high number of faulty columns. For example, the controller 120 may be configured to determine a number of error locations of the region based on stored information (e.g., error location data 172) and may compare the number of error locations to a threshold 176. If the number of error locations of the region is greater than or equal to the threshold, the region may be considered to be too unreliable to store data, such as encoded data (e.g., a codeword produced by an error correction code (ECC) engine 188). Rather than identifying the region as bad (e.g., as unusable to store data), the controller 120 may generate one or more parameters to be applied to the encoded data so that a portion, but not all, of the encoded data is stored at the region. For example, the one or more parameters may be applied to the encoded data to generate portions of the encoded data to be stored at a different region (or different regions) of the memory. In addition, the one or more parameters may be used to combine the portions of the encoded data after the portions are read from the region and the different region(s). By storing the portion of the encoded data at the region (and by storing other portions of the encoded data at a different region (or at different regions)), the data storage device 102 may use the region to store data and to read data despite the region being considered too unreliable (based on the number of error locations in the region) to store the encoded data.

The data storage device 102 and the host device 150 may be operationally coupled via a connection (e.g., a communication path 110), such as a bus or a wireless connection. For example, the data storage device 102 may include a host interface 108 that enables communication via the communication path 110 between the data storage device 102 and the host device 150, such as when the host interface 108 is communicatively coupled to the host device 150. The data storage device 102 may be embedded within the host device 150, such as in accordance with a Joint Electron Devices Engineering Council (JEDEC) Solid State Technology Association Universal Flash Storage (UFS) configuration. Alternatively, the data storage device 102 may be removable from the host device 150 (i.e., "removably" coupled to the host device 150). As an example, the data storage device 102 may be removably coupled to the host device 150 in accordance with a removable universal serial bus (USB) configuration.

In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the host device 150 indirectly, e.g., via a network. For example, the data storage device 102 may be a network-attached storage (NAS) device or a component (e.g. a solid-state drive (SSD) device) of a data center storage system, an enterprise storage system, or a storage area network.

For example, the data storage device 102 may be configured to be coupled to the host device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The host device 150 may include a processor and a memory. The memory may be configured to store data and/or instructions that may be executable by the processor. The memory may be a single memory or may include multiple memories, such as one or more non-volatile memories, one or more volatile memories, or a combination thereof. The host device 150 may issue one or more commands to the data storage device 102, such as one or more requests (e.g., a request 134) to erase data from, read data from, or write data to the memory 104 of the data storage device 102. For example, the host device 150 may be configured to provide data, such as user data 132, to be stored at the memory 104 or to request data to be read from the memory 104. The host device 150 may include a mobile telephone, a music player, a video player, a gaming console, an electronic book reader, a personal digital assistant (PDA), a computer, such as a laptop computer or notebook computer, any other electronic device, or any combination thereof, as illustrative, non-limiting examples.

The host device 150 communicates via a memory interface that enables reading data from the memory 104 and writing data to the memory 104. For example, the host device 150 may operate in compliance with a Joint Electron Devices Engineering Council (JEDEC) industry specification, such as a Universal Flash Storage (UFS) Host Controller Interface specification. As other examples, the host device 150 may operate in compliance with one or more other specifications, such as a Secure Digital (SD) Host Controller specification, as an illustrative, non-limiting example. The host device 150 may communicate with the memory 104 in accordance with any other suitable communication protocol.

The memory 104 of the data storage device 102 may include a non-volatile memory. The memory 104 may have a two-dimensional (2D) memory configuration. Alternatively, the memory 104 may have another configuration, such as a three-dimensional (3D) memory configuration. For example, the memory 104 may include a three-dimensional (3D) memory configuration that is monolithically formed in one or more physical levels of arrays of memory cells having an active area disposed above a silicon substrate. In some implementations, the memory 104 may include circuitry associated with operation of the memory cells (e.g., storage elements).

The memory 104 may include one or more memory dies 103. The one or more memory dies 103 may include multiple regions, such as a first region 141, a second region 142, a third region 143, a fourth region 144, and a fifth region 145. One or more of the regions 141-145 may be included in the same die, the same plane, the same block (e.g., an erase block), the same wordline, and/or the same page. For example, the first region 141 may include a first page of the memory 104 and the second region 142 may include a second page of the memory 104 that is positioned adjacent to the first page. Each of the regions 141-145 may be configured (e.g., sized) to store encoded data, such as one or more codewords that include a data portion and a parity portion. In some implementations, each region may be the same size (e.g., each region may include the same number of storage elements, such as the same number of memory cells). Although the one or more memory dies 103 are depicted as including five regions, in other implementations, the one or more memory dies 103 may include more than or fewer than five regions. In some implementations, each of the regions 141-145 may include one or more groups of storage elements. Each group of storage elements may include multiple storage elements (e.g., memory cells) and may be configured as a page of a word line.

The memory 104 may include support circuitry, such as read/write circuitry 140, to support operation of the one or more memory dies 103. Although depicted as a single component, the read/write circuitry 140 may be divided into separate components of the memory 104, such as read circuitry and write circuitry. The read/write circuitry 140 may be external to one or more memory dies of the memory 104. Alternatively, one or more individual memory dies may include corresponding read/write circuitry that is operable to read data from and/or write data to storage elements within the individual memory die independent of any other read and/or write operations at any of the other memory dies.

The controller 120 is coupled to the memory 104 (e.g., the one or more memory dies 103) via a bus 106, an interface 107 of the controller 120 (e.g., interface circuitry), an interface 109 of the memory 104 (e.g., interface circuitry), another structure, or a combination thereof. For example, when the one or more memory dies 103 include multiple memory dies, the bus 106 may include multiple distinct channels to enable the controller 120 to communicate with each of the multiple memory dies in parallel with, and independently of, communication with the other memory dies. In some implementations, the memory 104 may be a flash memory.

The controller 120 is configured to receive data and instructions from the host device 150 and to send data to the host device 150. For example, the controller 120 may send data to the host device 150 via the host interface 108, and the controller 120 may receive data from the host device 150 via the host interface 108. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 is configured to send a read command to the memory 104 to access data from a specified address of the memory 104. The read command may specify the physical address of a portion of the memory 104 (e.g., a physical address of a word line of the memory 104).

The controller 120 may include a memory 170, a data organizer 186, an error correction code (ECC) engine 188, and a parameter engine 190. The parameter engine 190 may be configured to identify one or more regions of the memory 104 that are indicated as unreliable. For example, the parameter engine 190 may receive error location data 172 (e.g., error location information) that indicates one or more faulty locations of the regions 141-145. For example, the error location data 172 may indicate a number and/or a location of faulty storage elements, faulty bit lines (e.g., faulty columns), faulty pages, faulty wordlines, faulty blocks, or a combination thereof, as illustrative, non-limiting examples.

The parameter engine 190 may compare the number of error locations for each region to a threshold 176 (e.g., a threshold number of error locations). If a number of error locations of a particular region is less than the threshold 176, the particular region may be considered usable to reliably store data. If a number of error locations of the particular region is greater than or equal to the threshold 176, the particular region may be considered unreliable to store data. Instead of identifying the particular region as unreliable (e.g., bad and unusable to store data), the parameter engine 190 may, in response to a determination that the particular region is unreliable, generate a set of one or more parameters to be used by the data storage device 102 to store data to and read data from the particular region.

Figure 2:
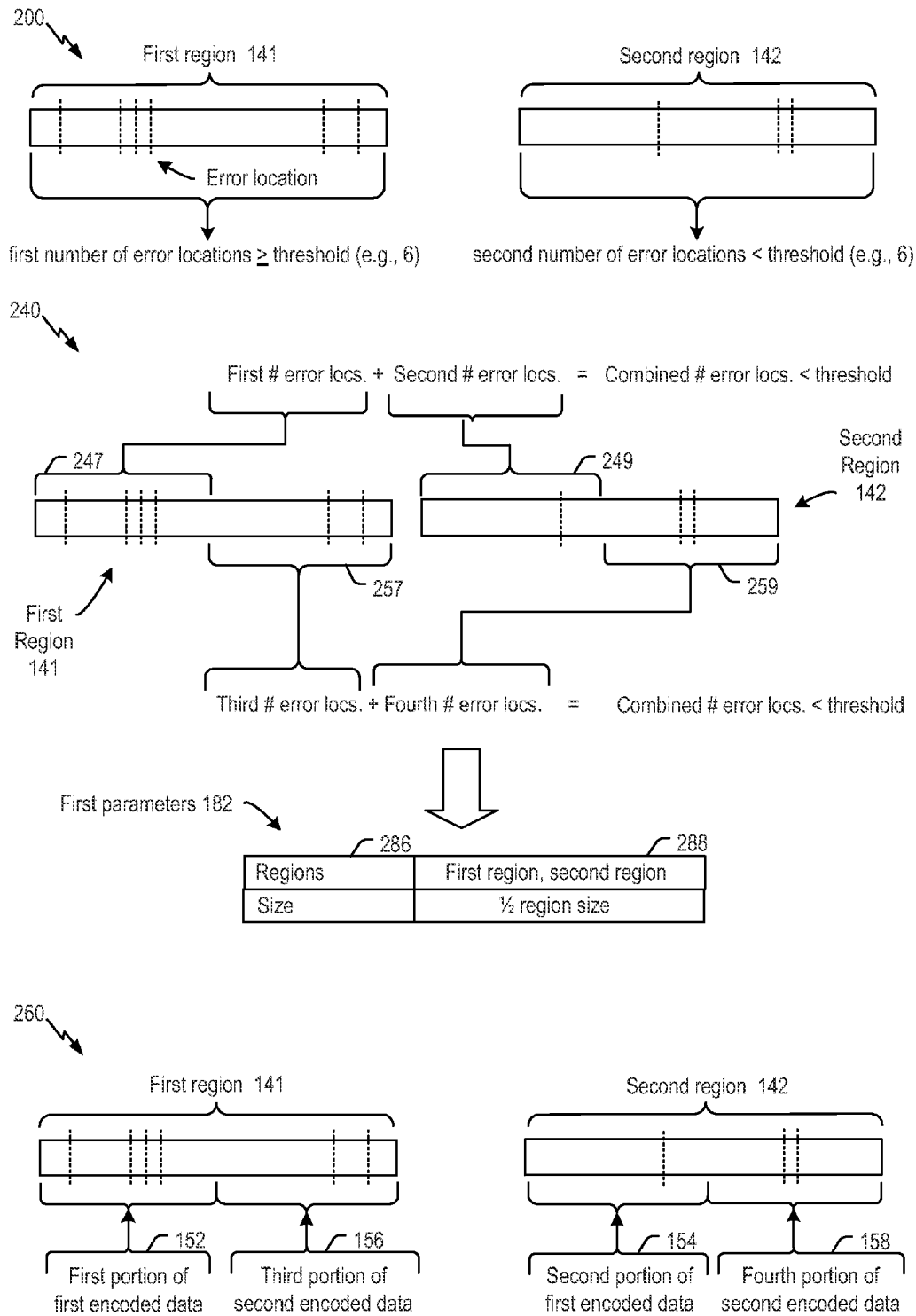
FIG. 2 is a diagram that illustrates an example of generating one or more parameters by the system of FIG. 1.

Referring to FIG. 2, an illustrative example of generation of a set of one or more parameters by the parameter engine 190 is depicted. The first region 141 and the second region 142 of the memory 104 are depicted at 200. Each of the first region 141 and the second region 142 include corresponding error locations that are distributed as indicated by the dashed lines. The parameter engine 190 may determine a number and/or a location of errors in the first region 141 and/or in the second region 142 based on the error location data 172. For example, the parameter engine 190 may determine that the first region 141 includes a first number of error locations (e.g., six error locations) and that the second region 142 includes a second number of error locations (e.g., three error locations).

For each region, the parameter engine 190 may compare the corresponding number of error locations to the threshold 176. For example, the parameter engine 190 may compare the first number of error locations (e.g., six) to the threshold 176 (e.g., having a value of six) and may determine that the first number of error locations is greater than or equal to the threshold 176. Accordingly, the parameter engine 190 may consider the first region 141 to be unreliable. As another example, the parameter engine 190 may compare the second number of error locations (e.g., three) to the threshold 176 (e.g., having a value of six) and may determine that the second number of error locations is less than the threshold 176. Accordingly, the parameter engine 190 may consider the second region 142 to be reliable.

In response to the first region 141 being considered unreliable, the parameter engine 190 may identify a group of multiple regions that includes the first region 141. The parameter engine 190 may identify the group of multiple regions such that an average number of error locations per region (of the group of multiple regions) is less than or equal to a value that is one less than the threshold 176 (e.g., if the threshold is six, the average would be 5 or less). For example, the group of regions may include the first region 141 and the second region 142. Although the group of regions is described as including two regions, in other implementations, the group of regions may include more than two regions.

The parameter engine 190 may divide the group of regions into multiple sections at 240. For example, the parameter engine 190 may divide each of the first region 141 and the second region 142 into two equally size sections. The parameter engine 190 may combine each section of the first region 141 with another section of the second region 142 and determine (e.g., test) whether a combined number of error locations of the two sections is less than the threshold 176. For example, the parameter engine 190 may combine a first section 247 (having a first number of error locations) of the first region 141 and a first section 249 (having a second number of error locations) of the second region 142. A combined number of errors (e.g., five) of the first sections 247, 249 may be less than the threshold 176 (e.g., six). As another example, the parameter engine 190 may combine a second section 257 (having a third number of error locations) of the first region 141 and a second section 259 (having a fourth number of error locations) of the second region 142. A combined number of errors (e.g., four) of the second sections 257, 259 may be less than the threshold 176 (e.g., six).

In response to one of the combined number of errors locations being greater than or equal to the threshold 176, the parameter engine 190 may identify the first region 141 as faulty (e.g. bad) or may attempt to divide the group of regions (e.g., the first region 141 and the second region 142) into different sized sections, such as a first section that is a quarter of a region size and a second section that is three quarters of the region size. Additionally or alternatively, the parameter engine 190 may determine (e.g., select) another group of regions that includes the first region 141 and may divide the other group of regions as described above. The parameter engine 190 may perform a number of attempts to divide the first region 141 up to a threshold number of attempts; after which, if the combined number of error locations for each section of the first region 141 is not less than the threshold 176, the first region 141 may be identified as faulty (e.g., unreliable).

In response to the combined number of error locations for each section of the first region 141 being less than the threshold 176, the parameter engine 190 may generate a set of one or more parameters, such as a first set of parameters 182. The first set of parameters 182 are depicted by a table that includes a first column 286 of parameter identifiers and a second column 288 of parameter values. A first parameter identifier "Regions" may have a corresponding parameter value that indicates that the first set of parameters 182 corresponds to the first region 141 and the second region 142. A second parameter identifier "Size" corresponds to a section size that the regions 141, 142 are to be divided into, such as one half a size of each of the regions 141, 142. The first set of parameters 182 may be included as an entry in the parameters 180 stored at the memory 170. For example, the parameters 180 may include a table of one or more entries (e.g., one or more sets of parameters), where each entry included in the parameters 180 may be indexed by location identifiers, such as addresses, that correspond to the regions included in the entry.

The first set of parameters 182 may be applied to first data to be stored at the first region 141 and to second data to be stored at the second region 142. For example, the first data may include or correspond to first encoded data 122 generated by the ECC engine 188 and the second data may include or correspond to second encoded data 124 generated by the ECC engine 188, as described further herein. The first encoded data 122 may be divided into a first portion 152 and a second portion 154 based on the size parameter value of the first set of parameters 182. As another example, the second encoded data 124 may be divided into a third portion 156 and a fourth portion 158 based on the size parameter value of the first set of parameters 182.

The first portion 152 of the first encoded data 122 and the third portion 156 of the second encoded data 124 may be stored at the first region 141 and the second portion 154 of the first encoded data 122 and the fourth portion of the second encoded data 124 may be stored at the second region 142. Stated differently, the first portion 152 and the second portion 154 of the first encoded data 122 may be stored at the first section 247 of the first region 141 and at the first section 249 of the second region 142, respectively, as illustrated at 260. Additionally, the third portion 156 and the fourth portion 158 of the second encoded data 124 may be stored at the second section 257 of the first region 141 and at the second section 259 of the second region 142, respectively. Accordingly, when the first region includes a set of error locations, data stored at the first region 141 may include the first portion 152 that is stored at a first subset of error locations of the set of error locations and may include the third portion that is stored at a second subset of error locations of the set of error locations.

Referring to FIG. 1, the parameter engine 190 may generate the first set of parameters 182 for the first group of regions that includes the first region 141 and the second region 142. Additionally, the parameter engine 190 may generate the second set of parameters 184 for a second group of regions that includes the third region 143, the fourth region 144, and the fifth region 145. For example, the parameter engine 190 may generate the second set of parameters 184 in response to a determination that the third region 143 includes a number of error locations that is greater than or equal to the threshold 176. The parameter engine 190 may select a second group of regions that includes the third region 143, the fourth region 144, and the fifth region 145. The parameter engine 190 may divide the second group of regions into multiple sections and may identify three combinations of sections that each correspond to a combined number of error locations that is less than the threshold 176. The parameter engine 190 may generate the second set of parameters 184 that includes a first parameter value that indicates that the second set of parameters 184 corresponds to the third region 143, the fourth region 144, and the fifth region 145. Additionally or alternatively, the second set of parameters 184 may include a set of one or more values that indicate different sizes of sections of the third region 143, the fourth region 144, and the fifth region 145 to be combined.

The memory 170 may include the error location data 172, the threshold 176, and the parameters 180 (e.g., storage parameters). The error location data 172 (e.g., error location information) may indicate one or more faulty locations of the regions 141-145. For example, the error location data 172 may indicate a number and/or a location of faulty storage elements, faulty bit lines (e.g., faulty columns), faulty pages, faulty wordlines, faulty blocks, or a combination thereof, as illustrative, non-limiting examples.

The threshold 176 may include or correspond to a threshold number of error locations and may be used by the parameter engine 190. The threshold number of error locations may be fewer than or equal to a correction capability of the ECC engine 188. As an illustrative, non-limiting example, when the size of a particular region is 2 kilobytes and when the correction capability of the ECC engine 188 is 100 bit errors per 2 kilobytes, the threshold number of error locations may be a value less than or equal to 100.

The parameters 180 may include parameters to be used to store data at one or more groups of regions. For example, the parameters 180 may include the first set of parameters 182 (e.g., a first set of one or more parameters) that corresponds to the first group of regions (e.g., the first region 141 and the second region 142). As another example, the parameters 180 may include the second set of parameters 184 (e.g., a second set of one or more parameters) that corresponds to the second group of regions (e.g., the third region 143, the fourth region 144, and the fifth region 145). Each set of parameters included in the parameters 180 may be indexed by region identifiers for the set of parameters. For example, the first set of parameters 182 may be indexed by a first region identifier, such as a first physical address that corresponds to the first region 141, and may be indexed by a second region identifier, such as a second physical address that corresponds to the second region 142.

The ECC engine 188 may be configured to receive data, such as the user data 132, and to generate encoded data, such as one or more error correction code (ECC) codewords (e.g., including a data portion and a parity portion) based on the data. For example, the ECC engine 188 may receive the user data 132 and may generate first encoded data 122 (e.g., a first codeword) and/or second encoded data 124 (e.g., a second codeword). To illustrate, the ECC engine 188 may include an encoder configured to encode the data using an ECC encoding technique. The ECC engine 188 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

Additionally or alternatively, the ECC engine 188 may include a decoder configured to decode data read from the memory 104 to detect and correct bit errors that may be present in the data. For example, the ECC engine 188 may correct a number of bit errors up to an error correction capability of an ECC technique used by the ECC engine 188. A number of errors identified by the ECC engine 188 may be tracked by the controller 120. For example, based on the number of errors, the ECC engine 188 may determine a bit error rate (BER) associated with the memory 104.

The data organizer 186 may be configured to use the parameters 180 to generate data to be stored at the memory 104. For example, the data organizer 186 may be configured to receive encoded data to be stored at the memory 104, such as the first encoded data 122 to be stored at a first physical address (corresponding to the first region 141) of the memory 104 and the second encoded data 124 to be stored at a second physical address (corresponding to the second region 142) of the memory 104. The data organizer 186 may access the first set of parameters 182 that correspond to the first region 141 and the second region 142 based on the first physical address and/or the second physical address. The data organizer 186 may apply the first set of parameters 182 to partition the first encoded data 122 into a first portion 152 and a second portion 154, and to partition the second encoded data 124 into a third portion 156 and a fourth portion 158. A first size of the first portion 154 may be the same as or different than a second size of the second portion 154.

The data organizer 186 may combine the first portion 152 of the first encoded data 122 and the third portion 156 of the second encoded data 124 to generate first data 162, and the data organizer 186 may combine the second portion 154 of the first encoded data 122 and the fourth portion 158 of the second encoded data 124 to generate second data 164. For example, the data organizer 186 may perform an interleave operation to interleave the first encoded data 122 (e.g., a first codeword) and the second encoded data 124 (e.g., a second codeword) to produce the first data 162 that includes the first portion 152 and the third portion 156 and to produce the second data 164 that includes the second portion 154 and the fourth portion 158. The data organizer 186 may send the first data 162 to the memory 104 to be stored at the first region 141 and may send the second data 164 to the memory 104 to be stored at the second region 142. The data organizer 186 may include one or more buffers and/or one or more registers to store the encoded data 122, 124 and to store the portions 152, 154, 156, 158. The data organizer 186 may also include logic (e.g., hardware and/or software) to identify portions of the encoded data 122, 124 based on the parameters and to combine multiple portions to generate the first data 162 and the second data 164. In some implementations, the hardware and/or software of the data organizer 186 may be included in or correspond to a direct memory access (DMA) controller, as described further with reference to FIGS. 4 and 5.

During operation, the data storage device 102 may receive the request 134 from the host device 150 to store the user data 132 at the memory 104. The controller 120 may receive the user data 132 and may provide the user data 132 to the ECC engine 188 to be encoded. The ECC engine 188 may encode the user data 132 to generate the first encoded data 122 to be stored at the first address (corresponding to the first region 141) and to generate the second encoded data 124 to be stored at the second address (corresponding to the second region 142).

The data organizer 186 may receive the first encoded data 122 (to be stored at the first address) and the second encoded data 124 (to be stored at the second address). The data organizer 186 may access (e.g., search) the parameters 180 to identify if the parameters 180 include a set of parameters that corresponds to the first region 141 (e.g., the first address) and/or the second region 142 (e.g., the second address). If no parameters are found in the parameters 180, the data organizer 186 may send the first encoded data 122 to the memory 104 to be stored at the first region 141 and the data organizer 186 may send the second encoded data to the memory 104 to be stored at the second region 142. If the data organizer 186 identifies a set of parameters (e.g., the first set of parameters 182) that corresponds to the first region 141 and/or to the second region 142, the data organizer 186 may apply the first set of parameters 182 to the first encoded data 122 and to the second encoded data 124 to generate the first data 162 and the second data 164. The first data 162 may be sent to the memory 104, via the interfaces 107, 109 and the bus 106, to be stored at the first region 141. The second data 164 may be sent to the memory 104, via the interfaces 107, 109 and the bus 106, to be stored at the second region 142. Accordingly, portions of the first encoded data 122 (corresponding to the first address) and portions of the second encoded data 124 (corresponding to the second address) may be stored at multiple regions of the memory.

After storing the first data 162 and the second data 164, the data storage device 102 may receive another request from the host device 150 to read data corresponding to the first address (e.g., data corresponding to the first encoded data 122). Responsive to the request to read the data, the controller 120 determines whether the parameters 180 include a set of parameters that correspond to the first address (e.g., the first region 141). In response to a determination that the first address does not correspond to a set of parameters included in the parameters 180, the data organizer 186 may read data from the first region 141 and provide the data to the ECC engine 188 to be decoded.

In response to a determination that the first address corresponds to a set of parameters, such as the first set of parameters 182, the data organizer 186 may retrieve the first set of parameters 182 from the memory 170. Based on the first set of parameters 182, the controller 120 may determine that the data corresponding to the first address is stored at the first region 141 and at the second region 142. The controller 120 may issue a read command to the memory 104 to read the first region 141 and the second region 142.

In response to the read command, the controller 120 (e.g., the data organizer 186) may receive first read data associated with the first region 141 and second read data associated with the second region 142. Based on the first set of parameters 182, the data organizer 186 may partition each of the first read data and the second read data into multiple portions based on a size value included in the first set of parameters 182. The data organizer 186 may combine a first set of the multiple portions to generate a representation (e.g., a version) of the first encoded data 122. The representation of the first encoded data 122 may be provided to the ECC engine 188 to decode the representation of the first encoded data 122 to generate output data that is provided to the host device 150, responsive to the request to read the data corresponding to the first address.

In some implementations, the data storage device 102 may access the error location data 172 and may generate the parameters 180, such as the first set of parameters 182 and the second set of parameters 184. For example, the controller 120 (e.g., the parameter engine 190) may access the error location data 172 from the memory 170 responsive to a power-up operation (e.g., a power-up of the data storage device 102). To illustrate, the first set of parameters 182 may correspond to the first region 141 and the second region 142 and may be configured to be applied to a first set of codewords, such as a first codeword associated with the first encoded data 122 and a second codeword associated with the second encoded data 124. The second set of parameters 184 may correspond to the third region 143, the fourth region 144, and the fifth region 145, and may be configured to be applied to a second set of codewords, such as a third codeword, a fourth codeword, and a fifth codeword. After generating the parameters 180, the parameters 180 may be stored at the memory 170 (and/or at the memory 104) and may be used during a life of the data storage device 102 to generate data to be stored at the memory 104 and to organize data read from the memory 104. For example, after each power-up after the initial power-up, the controller 120 may access and use the parameters 180 generated in response to the initial power-up. In other implementations, the controller 120 may generate new parameters 180 with each power-up of the data storage device 102.

In some implementations, the controller 120 may include a buffer (not shown), such as a buffer random-access memory (BRAM). The buffer may be positioned between the data organizer 186 and the ECC engine 188. The buffer may be configured to receive and store one or more codewords generated by the ECC engine 188. Portions of the one or more codewords may be accessed from the buffer by the data organizer 186 to generate data based on application of a particular set of parameters of the parameters 180. For example, when the buffer stores the first encoded data 122 and the second encoded data 124, the data organizer 186 may access the first portion 152 and the third portion 156 from the buffer to generate the first data 162. Alternatively, or in addition, the buffer may be configured to receive one or more representations of codewords generated by the data organizer 186 based on application of a particular set of parameters of the parameters 180. For example, the data organizer 186 may receive the first read data associated with the first region 141 and the second read data associated with the second region 142, and the data organizer 186 may distribute portions of the first read data and the second read data to generate a representation of the first encoded data 122 at the buffer.

In some implementations, the error location data 172, the threshold 176, the parameters 180, or a combination thereof, may be stored at the memory 104. In other implementations, the controller 120 may include or may be coupled to a particular memory (e.g., the memory 170), such as a random access memory (RAM), that is configured to store the error location data 172, the threshold 176, the parameters 180, or a combination thereof, as illustrated in FIG. 1. Alternatively, or in addition, the controller 120 may include or may be coupled to another memory (not shown), such as a non-volatile memory, a RAM, or a read only memory (ROM). The other memory may be a single memory component, multiple distinct memory components, and/or may include multiple different types (e.g., volatile memory and/or non-volatile) of memory components. In some embodiments, the other memory may be included in the host device 150.

Although one or more components of the data storage device 102 have been described with respect to the controller 120, in other implementations certain components may be included in the memory 104. For example, one or more of the memory 170, the parameter engine 190, the ECC engine 188, and/or the data organizer 186 may be included in the memory 104. Alternatively, or in addition, one or more functions as described above with reference to the controller 120 may be performed at or by the memory 104. For example, one or more functions of the memory 170, the parameter engine 190, the ECC engine 188, and/or the data organizer 186 may be performed by components and/or circuitry included in the memory 104. Alternatively, or in addition, one or more components of the data storage device 102 may be included in the host device 150. For example, one or more of the memory 170, the parameter engine 190, the ECC engine 188, and/or the data organizer 186 may be included in the host device 150. Alternatively, or in addition, one or more functions as described above with reference to the controller 120 may be performed at or by the host device 150. For example, the one or more functions may be performed by a processor included in the host device 150

By generating the parameters 180 to be used to store portions of multiple codewords at different regions, a particular region considered to be unreliable may be used by the data storage device 102 rather than being identified as unusable. For example, the parameter engine 190 may consider multiple codewords that may be stored at the particular region to generate a set of parameters applied may result in error locations of the particular region being effectively distributed among the multiple codewords. By utilizing regions that would otherwise be identified as unusable, a storage capacity of the memory 104 of the data storage device 102 and a life of the memory 104 may be increased.

Figure 3:
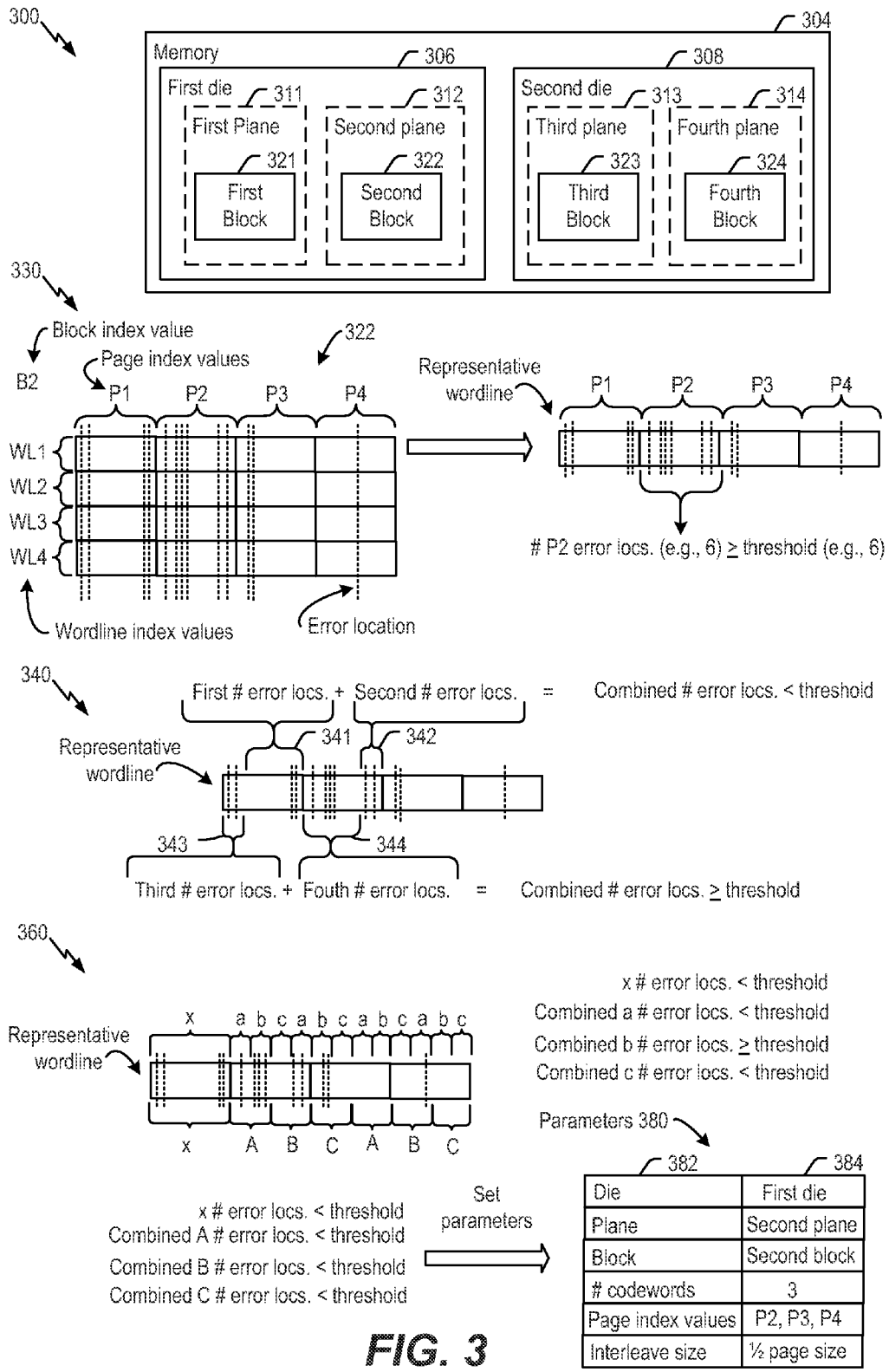
FIG. 3 is a diagram that illustrates another example of generating one or more parameters by the system of FIG. 1.

Referring to FIG. 3, a particular illustrative example of generation of one or more parameters is depicted. The one or more parameters may be associated with a memory 304, as depicted at 300. The memory 304 may be included in a data storage device. For example, the memory 304 may include or correspond to the memory 104 included in the data storage device 102 of FIG. 1.

The memory 304 may include a first memory die 306 and a second memory die 308. For example, the first memory die 306 and the second memory die 308 may include or correspond to the one or more memory dies 103 of FIG. 1. Although the memory 304 is illustrated as including two memory dies, in other implementations the memory 304 may include more than two dies or may include one die. Each of the memory dies 306, 308 may include multiple planes. For example, the first memory die 306 may include a first plane 311 and a second plane 312, and the second memory die 308 may include a third plane 313 and a fourth plane 314. Although each of the memory dies 306, 308 is illustrated as including two planes, in other implementations a particular memory die may include more than two planes or may include one plane. Each of the planes 311-314 may include one or more blocks (e.g., erase blocks). For example, the first plane 311 may include a first block 321, the second plane 312 may include a second block 322, the third plane may include a third block 323, and the fourth plane 314 may include a fourth block 324. Although each of the planes 311-314 is illustrated as including one block, in other implementations a particular plane may include multiple blocks. In some implementations, the blocks 321-324 may be associated with a meta block of the memory 304. When data is written to the memory 304, a meta block of the memory 304 may be selected and data may be written to each block of the meta block before data is written to one or more blocks that are not included in the meta block. The memory 304 may include multiple meta blocks and, when data is to be written to the memory 304, a particular meta block may be selected and the data may be written to the blocks of the particular meta block. After the blocks of the particular meta block are full, the data storage device may select another meta block to store additional data.

An illustrative embodiment of the second block 322 is depicted at 330. The second block 322 may correspond to a block index value (B2). Block index values may be assigned to each block included in the memory 304 to identify each block within a corresponding plane of the memory 304, to uniquely identify each block within a particular memory die, and/or to uniquely identify each block within a particular plane. For example, each of the blocks 321-324 may correspond to the block index value (B2) to identify each of the blocks 321-324 within a corresponding plane. To illustrate, the first block 321 may be identified within the first plane 311 and the second block 322 may be identified within the second plane 312. The second block 322 may include multiple wordlines and each wordline may include one or more pages. Each page of the one or more pages may include one or more storage elements (e.g., memory cells). Each wordline may have a corresponding wordline index value and each page may have a corresponding page index value. In some implementations, a size of each page may be equal to a size of a codeword, such as the first encoded data 122 or the second encoded data 124 of FIG. 1, to be stored at the memory 304. Although the second block 322 is illustrated as including four wordlines and four pages per wordline, in other implementations the second block 322 may include more than four wordlines or fewer than four wordlines and/or more than four pages per wordline or fewer than four pages per wordline. In some implementations, one or more blocks of the memory 304 may have the same number of wordlines and/or the same number of pages per wordline. In other implementations, the one or more blocks of the memory 304 may a different number of wordlines and/or a different number of pages per wordline.

The memory 304 may be associated with and/or correspond to error location information, such as the error location data 172 of FIG. 1. The error location information may indicate error locations of one or more dies of the memory 304. For example, the error location information may indicate faulty columns, such as faulty bit lines, of the blocks 321-324 of the memory 304. The faulty columns corresponding to the second block 322 are depicted as dashed lines that extend through each of the wordlines of the second block 322.

In response to a power-up of the data storage device, a controller, such as the controller 120 of FIG. 1, of the data storage device may access the error location information. Additionally, for a particular block, the controller may select a representative wordline from the particular block. For example, the controller may select a first wordline having a wordline index of WL1 from the second block 322 to be a representative wordline of the second block 322. Based on the error location information, the controller may determine a number of error locations of each page of the representative wordline. For each page, the controller may compare the corresponding number of error locations to a threshold, such as the threshold 176 of FIG. 1. If the number of error locations of a particular page is greater than or equal to the threshold, the particular page may be considered unreliable and the controller may determine one or more parameters that may be applied to reliably store data at the particular page. To illustrate, the controller may determine that the number of error locations of the second page (P2) of the representative wordline is six and may determine that the number of error locations of the second page (P2) is greater than or equal to the threshold.

The controller may attempt to generate the one or more parameters by dividing codewords between the second page P2 and an adjacent page, as depicted at 340. For example, the controller may include or correspond to the controller 120 of FIG. 1 that includes the parameter engine 190. The controller may select the second page P2 and an adjacent page to the second page P2, such as the first page P1. In some implementations, the second page (P2) is positioned at the end of a wordline, and the adjacent page may be included in another block that has the same block index value as the second block 322. The adjacent page may be included in a different plane than the second plane 312 and/or may be included in a different die than the first memory die 306.

The controller may divide each of the first page P1 and the second page P2 into multiple sections. For example, the controller may divide each of the first page P1 and the second page P2 into a first section 341. 344 having a first size and a second section 343, 342 having a second size. The first size and the second size may be the same size or may be different sizes. A combined size of a first section 341 of the first page (P1) and a second section 342 of the second page (P2) may be equal to a size of each of the first page (P1) and the second page. Additionally, a combined size of a second section 343 of the first page (P1) and a first section 344 of the second page (P2) may be equal to a size of each of the first page (P1) and the second page. Although the controller is described as dividing each of the pages (P1, P2) into two sections, in other implementations each of the pages (P1, P2) may be divided into more than two sections.

The controller may determine whether combining the first section 341 of the first page (P1) and the second section 342 of the second page (P2) results in a first total number of error locations that is less than the threshold. For example, the controller may determine the first total number of error locations by adding a first number of error locations of the first section 341 of the first page (P1) and a second number of error locations of the second section 342 of the second page (P2). In response to the first number of error locations being less than the threshold, the controller may determine whether combining the second section 343 of the first page (P1) and the first section 344 of the second page (P2) results in a second total number of error locations that is less than the threshold. For example, the controller may determine the second total number of error locations by adding a third number of error locations of the second section 343 of the first page (P1) and a fourth number of error locations of the first section 344 of the second page (P2).

If each of the first number of error locations and the second number of error locations is determined to be less than the threshold, the controller may generate (e.g., store) one or more parameters to be applied to data to be written to, read from, or erased from the first page (P1) and the second page (P2). For example, the one or more parameters may indicate that a first codeword that corresponds to an address of the first page (P1) is to be stored at the first section 341 of the first page (P1) and at the second section 342 of the second page (P2), and that a second codeword that corresponds to an address of the second page (P2) is to be stored at the second section 343 of the first page (P2) and at the first section 344 of the second page (P2).

If one of the first number of error locations or the second number of error locations is determined to be greater than or equal to the threshold, the controller may identify the second block 322 as faulty (e.g., unreliable to store data) or may perform one or more additional attempts to generate the one or more parameters. For example, the controller may attempt to divide the first page (P1) and the second page (P2) using different sizes for the first section and the second section. Additionally or alternatively, the controller may attempt to divide the second page (P2) and another page, such as a third page (P3) that is adjacent to the second page (P2).

Additionally or alternatively, the controller may attempt to generate the one or more parameters by trying to divide codewords between the second page P2 and two or more additional pages, as depicted at 360. For example, the controller may attempt to generate the one or more parameters by attempting to map three codewords across three pages of the representative wordline, such as the second page (P2), the third page (P3), and the fourth page (P4). For example, the controller may divide the pages (P2-P4) into a first number of equally sized sections having labels "a", "b", "c". The sections labeled "a" may be associated with a first codeword, the sections labeled "b" may be associated with a second codeword, and the sections labeled "c" may be associated with a third codeword. The controller may not use the first page (P1) because the first page has the most number of error locations out of the first page (P1), the third page (P3), and the fourth page (P4). Although the controller is described as attempting to using three pages (e.g., three codewords), in other implementations the controller may use more than three pages. For example, the controller may use all the pages of the representative wordline of the block. As another example, the controller may use one or more pages from blocks of the memory 304 having the same block index value as the second block 322 and/or may use one or more pages from wordlines having the same wordline index value as the representative wordline of the second block 322.

The controller may determine whether multiple sections, that each have the same label, include a total number of error locations that is less than the threshold. For example, the controller may determine that a total number of error locations of the sections labeled "a" is less than the threshold value and that a total number of error locations of the sections labeled "c" is less than the threshold value. The controller may determine that a total number of error locations of the sections labeled "b" is greater than or equal to the threshold value.

Based on the total number of error locations of the sections labeled "b" being greater than or equal to the threshold value, the controller may identify the second block 322 as unreliable to store data (e.g., faulty) or may perform one or more additional attempts to generate the one or more parameters. For example, the controller may divide the pages (P2-P4) into a first number of equally sized sections having labels "A", "B", "C". The sections labeled "A" may be associated with a first codeword, the sections labeled "B" may be associated with a second codeword, and the sections labeled "C" may be associated with a third codeword.

The controller may determine whether multiple sections, that each have the same label, include a total number of error locations that is less than the threshold. In response to a determination that each of a first total number of error locations of the sections labeled "A", a second total number of error locations of the sections labeled "B", and a third total number of error locations of the sections labeled "C" is less than the threshold, the controller may generate the one or more parameters, such as a set of parameters 380. The set of parameters 380 may include or correspond to the second set of parameters 184 of FIG. 1. The set of parameters 380 may be applied to codewords to be stored at the pages (P2-P4) of the second block 322 (e.g., to map each codeword to different sections of the pages (P2-P4).

The set of parameters 380 may include a first column 382 of parameter identifiers and a second column 384 of parameter values that each correspond to a different parameter identifier. To illustrate, the die identifier may correspond to the first memory die 306, the plane identifier may correspond to the second plane 312, the block identifier may correspond to the second block 322, the number of codewords identifier may correspond to a value of 3, the page index values identifier may correspond to the pages (P2-P4), and the interleave size identifier may have a value of one half the size of a page. In some implementations, the parameters 380 may be accessed and applied each time a codeword is to be stored at a page of the block 322 that has a page index value of "P2", "P3", or "P4".

By generating the set of parameters 380, the second page (P2) considered to be unreliable may be used by the data storage device rather than being identified as unreliable (e.g. faulty). For example, the controller may determine the set of parameters 380 that, when applied, cause multiple codewords to be stored at the second page (P2). By generating the set of parameters 380 so that the second page (P2) can be utilized by the data storage device, a storage capacity of the memory 304 and a life of the memory 304 may be increased.

Figure 4:
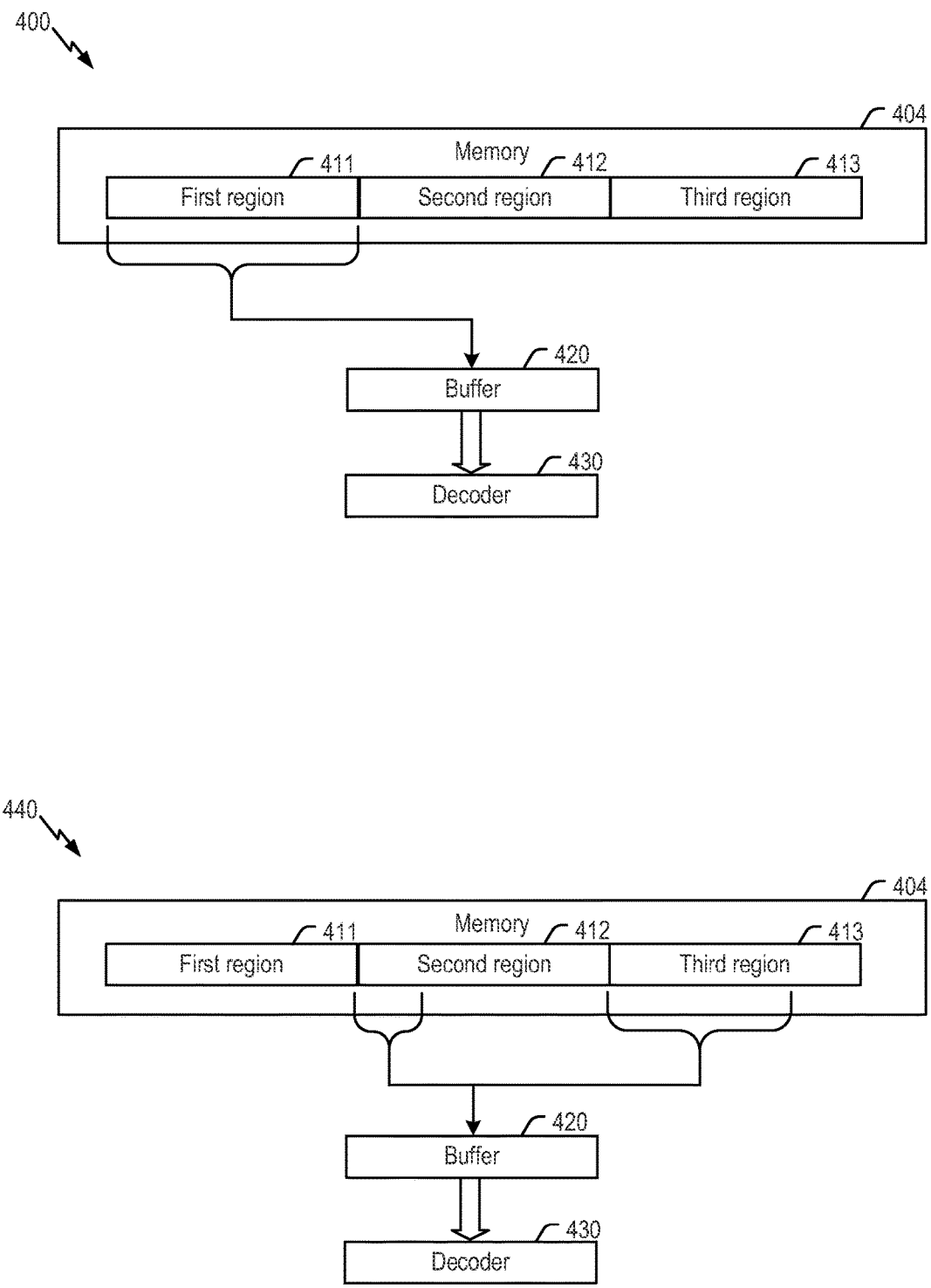
FIG. 4 depicts illustrative examples of read operations that may be performed by the system of FIG. 1.

Referring to FIG. 4, illustrative examples of read operations performed a data storage device are depicted. The data storage device may include or correspond to the data storage device 102 of FIG. 1.

A first illustrative example of a first read operation performed at the data storage device is depicted at 400. The data storage device may include a memory 404, a buffer 420, and a decoder 430. The memory 404 may include or correspond to the memory 104 of FIG. 1 and/or the memory 304 of FIG. 3. The memory 404 may include multiple regions, such as a first region 411, a second region 412, and a third region 413. The regions 411-413 may include or correspond to one or more of the regions 141-145 of FIG. 1. The buffer 420 may include or correspond to the data organizer 186 of FIG. 1 or to a buffer random-access memory (BRAM) that is distinct from the data organizer 186 of FIG. 1. The decoder 430 may include or correspond to the ECC engine 188 of FIG. 1.

The data storage device may receive a first request to read a first codeword stored at a first address that corresponds to the first region 411. Responsive to the first request, the data storage device (e.g., a controller of the data storage device) may determine that the first address (e.g., the first region 411) does not correspond to one or more storage parameters, such as the parameters 180 of FIG. 1. Accordingly, a read operation may be performed to read data from the first region 411. The data read from the first region 411 may be provided to the buffer 420. The data stored at the buffer 420 may include a representation of the first codeword stored at the first address. The data stored at the buffer 420 may be provided to the decoder 430 to be decoded.

A second illustrative example of a second read operation performed at the data storage device is depicted at 440. The data storage device may receive a second request to read a second codeword stored at a second address that corresponds to the second region 412. Responsive to the second request, the data storage device (e.g., the controller of the data storage device) may determine that the second address (e.g., the second region 412) corresponds to one or more storage parameters, such as the first set of parameters 182 of FIG. 1. The one or more storage parameters may indicate that a first portion of the second codeword is stored at the second region 412 and that a second portion of the second codeword is stored at the third region 413. A size of the first portion may be the same as or different than a size of the second portion.

A read operation may be performed to read the first portion from the second region 412 and to read the second portion from the third region 413. First data (e.g., corresponding to the first portion) read from the second region 412 and second data (e.g., corresponding to the second portion) read from the third region 413 may be provided to the buffer 420. The first data and the second data stored at the buffer 420 may include a representation of the second codeword stored at the second address. The first data and the second data stored at the buffer 420 may be provided to the decoder 430 to be decoded.

Thus, FIG. 4 provides a first example of reading data from the memory 404 without applying one or more storage parameters and provides a second example of applying one or more storage parameters to read data from the memory 404.

Figure 5:
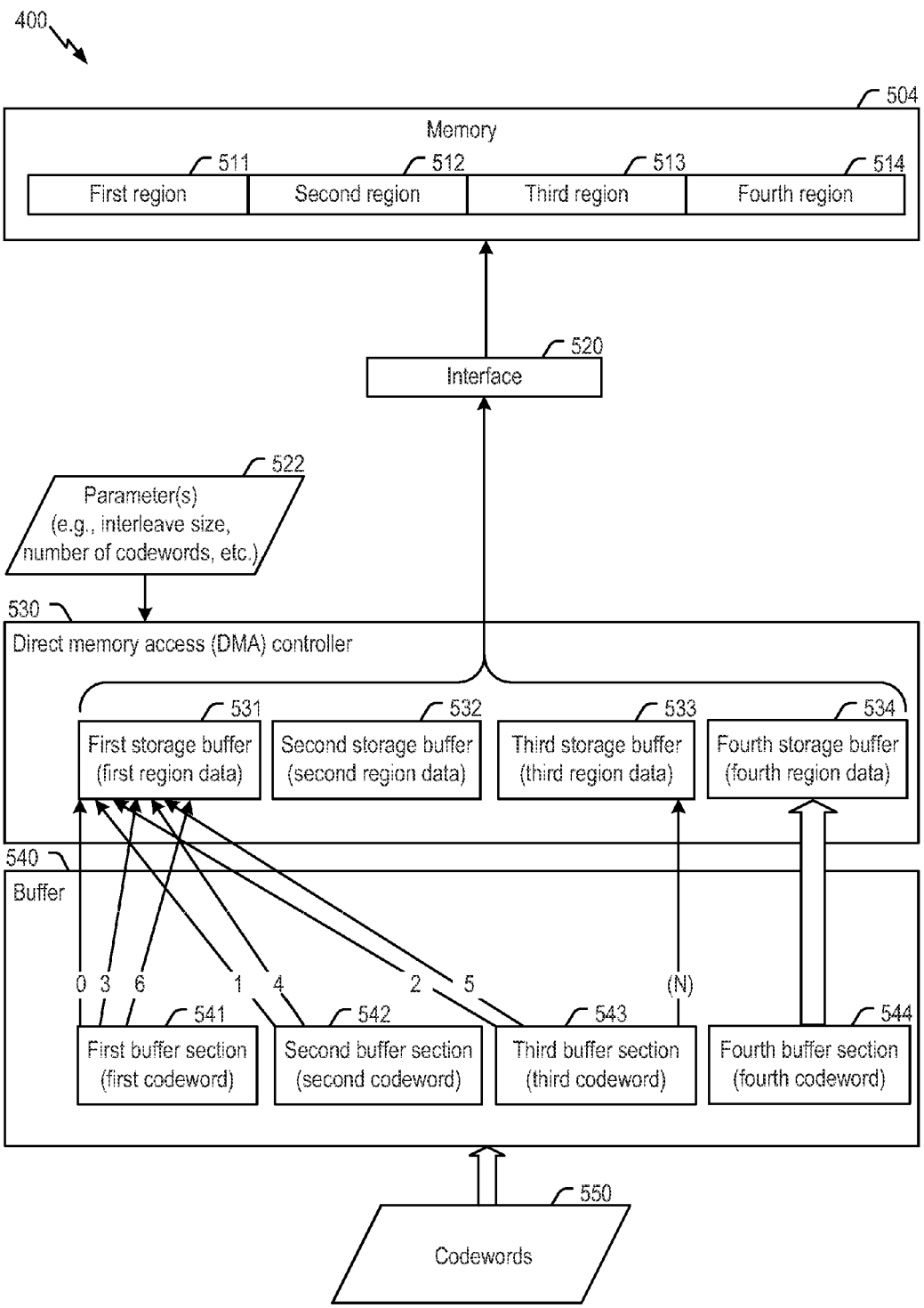
FIG. 5 is a block diagram of a particular illustrative embodiment of a portion of the system of FIG. 1.

Referring to FIG. 5, a particular illustrative embodiment of a system is depicted and generally designated 500. The system 500 may include or may be included in a data storage device, such as the data storage device 102 of FIG. 1. The system 500 may be configured to apply a set of parameters to multiple codewords to store data.

The data storage device may include a memory 504, an interface 520, a direct memory access (DMA) controller 530, and a buffer 540, such as a buffer random-access memory (BRAM). The memory 504 may include or correspond to the memory 104 of FIG. 1, the memory 304 of FIG. 3, or the memory 404 of FIG. 4. The memory 504 may include multiple regions, such as a first region 511, a second region 512, a third region 513, and a fourth region 514. The multiple regions may include or correspond to the regions 141-145 of FIG. 1. In some implementations, the regions 511-514 may be included in the same wordline of the memory 504. For example, the first region 511 may include a first physical page of the wordline, the second region 512 may include a second physical page of the wordline, the third region 513 may include a third physical page of the wordline, and the fourth region 514 may include a fourth physical page of the wordline.

The buffer 540 may be configured to receive codewords 550 to be stored at the memory 504. For example, the buffer 540 may receive the codewords 550 from an encoder, such as the ECC engine 188 of FIG. 1. The codewords 550 may include a first codeword associated with the first region 511, a second codeword associated with the second region 512, a third codeword associated with the third region 513, and a fourth codeword associated with the fourth region 514. In some implementations, each codeword may correspond to an address of the region that the codeword is associated with. Although the codewords 550 are described as including four codewords, in other implementations the codewords 550 may include more than four codewords or fewer than four codewords.

The buffer may include multiple buffer sections, such as a first buffer section 541, a second buffer section 542, a third buffer section 543, and a fourth buffer section 544. Each of the buffer sections 541-544 may be configured to store a corresponding codeword of the codewords 550. For example, the first buffer section 541 may be configured to store a first codeword, the second buffer section 542 may be configured to store a second codeword, the third buffer section 543 may be configured to store a third codeword, and the fourth buffer section 544 may be configured to store a fourth codeword. Although the buffer 540 is described as including four buffer sections, in other implementations the buffer 540 may include more than four buffer sections or fewer than four buffer sections.

The DMA controller 530 may be coupled to the buffer 540 and to the memory 504. For example, the DMA controller 530 may be coupled to the memory 504 via the interface 520. The interface 520 may include or correspond to the interface 107 or the interface 109 of FIG. 1. The DMA controller 530 may include or correspond to the data organizer 186 of FIG. 1.

The DMA controller 530 may include multiple storage buffers, such as a first storage buffer 531, a second storage buffer 532, a third storage buffer 533, and a fourth storage buffer 534. The DMA controller 530 may use each of the storage buffers 532-534 to generate (e.g., gather) data to be stored to the memory 504. For example, the first storage buffer 531 may be associated with first data to be written to the first region 511, the second storage buffer 532 may be associated with second data to be written to the second region 512, the third storage buffer 533 may be associated with third data to be written to the third region 513, and the fourth storage buffer 534 may be associated with fourth data to be written to the fourth region 514.

The DMA controller 530 may be configured to receive one or more parameters 522 associated with a write operation to write the codewords 550 to the memory 504. For example, the one or more parameters 522 may include or correspond to the parameters 180 of FIG. 1, such as the second set of parameters 184. The one or more parameters 522 may be based on error location information, such as error location information (e.g., the error location data 172 of FIG. 1) corresponding to one or more of the regions 511-514. To illustrate, the one or more parameters 522 may be based on error location information of the first region 511. For example, the error location information may identify a set of one or more error locations that correspond to the first region 511 and the one or more parameters 522 may be generated in response to a number of error locations in the set of one or more error locations being greater than a threshold, such as the threshold 176 of FIG. 1.

The one or more parameters 522 may indicate a number of codewords to be interleaved, a number of bits (e.g., an interleave size) from each codeword to be combined to generate write data, or a combination thereof. For example, the one or more parameters 522 may indicate that three codewords corresponding to the first region 511, the second region 512, and the third region 513 are to be interleaved. The DMA controller 530 may use (e.g., apply) the one or more parameters 522 to gather data from multiple codewords of the codewords 550 to interleave the gathered data to generate the first data to be written to the first region 511, the second data to be written to the second region 512, the third data to be written to the third region 513, and/or the data to be written to the fourth region 514, as described further herein.

Based on the one or more parameters 522, the DMA controller 530 may gather data from the first buffer section 541 (e.g., the first codeword), the second buffer section 542 (e.g., the second codeword), and the third buffer section 543 (e.g., the third codeword). For example, the DMA controller may gather 0-N groups of data from the buffer sections 541-543, where each group of data has a size equal to the number of bits (e.g., the interleave size) indicated by the one or more parameters 522, and where N is an integer that is greater than the number of codewords to be interleaved. The DMA controller 530 may gather the 0-N groups of data by alternating between (e.g., cycling among) the buffer sections 541-543. For example, the DMA controller 530 may gather a data group 0 from the first buffer section 541, followed by a data group 1 from the second buffer section 542, followed by a data group 3 from the third buffer section 543, followed by a data group 3 from the first buffer section 541, etc. The DMA controller 530 may store the gathered data groups at the first storage buffer 531 to generate the first write data. Accordingly, the first write data may include portions of each of the first codeword, the second codeword, and the third codeword.

When the first storage buffer 531 is full, the DMA controller 530 may store additional gathered data into the second storage buffer 532 to generate the second write data. Accordingly, the second write data may include portions of each of the first codeword, the second codeword, and the third codeword. When the second storage buffer is 532, the DMA controller 530 may store additional gathered data into the third storage buffer 533. Accordingly, the third write data may include portions of each of the first codeword, the second codeword, and the third codeword. The data from the fourth buffer section 544 may be stored into the fourth storage buffer 534 to generate fourth write data.

The DMA controller 530 may be configured to initiate the write operation to program the data from the storage buffers 531-534 to the regions 511-514. For example, the first data at the first storage buffer 531 may be programmed to the first region 511, the second data from the second storage buffer 532 may be programmed to the second region 512, the third data at the third storage buffer 533 may be programmed to the third region 513, and the fourth data at the fourth storage buffer 534 may be programmed to the fourth region 514. In some implementations, the DMA controller 530 may be configured to perform a burst write operation to write the first data, the second data, the third data, and the fourth data to the memory 504. The burst write operation may write an amount of data that is greater than an entirety of a single codeword, such as an amount of data that includes an entirety of two or more codewords. The burst write operation may be more efficient, as compared to the DMA controller 530 performing multiple write operations to write data to each of the regions 511-514, in terms of an amount of time that the DMA controller 530 accesses a bus (e.g., the bus 106 of FIG. 1) between the DMA controller 530 and the memory 504.

By applying the one or more parameters 522 to multiple codewords, the DMA controller 530 may generate data so that portions of the first codeword, the second codeword, and the third codeword are stored at each of the regions 511-513. To enable the DMA controller 530 to generate the first data, the second data, and the third data, the DMA controller 530 may include the multiple storage buffers 531-534 that are distinct from the buffer 540. Accordingly, the DMA controller 530 may perform a burst write operation to write the data from the multiple storage buffers 531-534 (that are internal to the DMA controller) to the memory 504.

Figure 6:
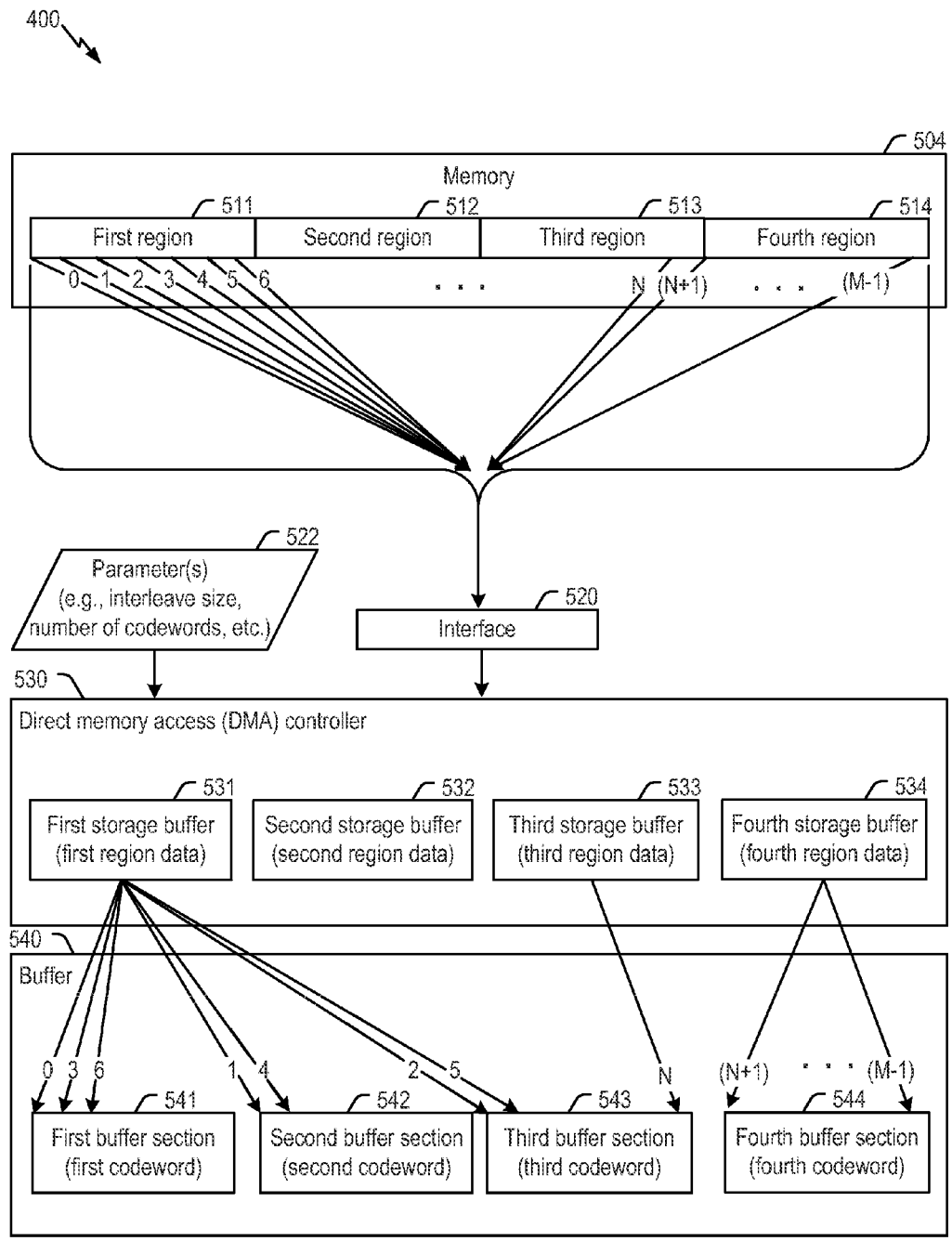
FIG. 6 is a block diagram of another particular illustrative embodiment of the portion of the system of FIG. 1.

Referring to FIG. 6, a particular illustrative embodiment of a system is depicted and generally designated 600. The system 600 may include or may be included in a data storage device, such as the data storage device 102 of FIG. 1. The system 600 may be configured to apply a set of parameters to data read from multiple regions of the memory 504.

The data storage device may receive a request to perform a read operation to read data corresponding to codewords stored at the regions 511-514 of the memory 504. In response to the read request, the DMA controller 530 may be configured to receive one or more parameters 522 associated with the read operation. For example, the one or more parameters 522 may indicate an amount of data to be de-interleaved to form multiple codewords and/or may indicate a number of interleaved codewords, such as 3 interleaved codewords, that correspond to data stored at the first region 511, the second region 512, and the third region 513.

Additionally, the DMA controller 530 may perform a read operation to receive data stored at the regions 511-514 from the memory 504. The data read from the regions 511-514 may include multiple groups of data bits (e.g., 0-M groups of data). In some implementations, the DMA controller 530 may be configured to perform a burst read operation to read first data from the first region 511, second data from the second region 512, third data from the third region 513, and fourth data from the fourth region 514. For example, the DMA controller 530 may perform a single burst read operation to read a portion of the memory 504 that includes the regions 511-514. The burst read operation may read an amount of data that is greater than a size of a codeword (e.g., greater than a size of a region). The burst read operation may be more efficient, as compared to the DMA controller 530 performing multiple read operations to read each of the regions 511-514, in terms of an amount of time that the DMA controller 530 accesses a bus (e.g., the bus 106 of FIG. 1) between the DMA controller 530 and the memory 504.

The DMA controller 530 may store the data read from the regions 511-514 into the storage buffers 531-534 of the DMA controller 530. For example, the DMA controller 530 may store first data read from the first region 511 at the first storage buffer 531, second data read from the second region 512 at the second storage buffer 532, third data read from the third region 513 at the third storage buffer 533, and fourth data read from the fourth region 514 at the fourth storage buffer 534.

The DMA controller 530 may be configured to apply the one or more parameters 522 to provide (e.g., distribute) the data from the storage buffers 531-534 to the buffer sections 541-544. For example, the DMA controller 530 may de-interleave the 0-(N) data groups from the storage buffers 531-533 to the buffer sections 541-543 to generate a first representation of a first codeword at the first buffer section 541, a second representation of a second codeword at the second buffer section 542, and a third representation of a third codeword at the third buffer section 543. Each group of data (of the 0-(N) data groups) may have a size equal to the number of bits (e.g., the interleave size) indicated by the one or more parameters 522, where N is an integer equal to a value determined based on an amount of data included in the regions 511-513 divided by the interleave size.

To de-interleave the data from the storage buffers 531-533, the DMA controller 530 may cyclically distribute the 0-(N) groups of data. For example, the DMA controller 530 may distribute (e.g., provide) a data group 0 from the first storage buffer 531 to the first buffer section 541, followed by a data group 1 from the first storage buffer 531 to the second buffer section 542, followed by a data group 2 from the first storage buffer 531 to the third buffer section 543, followed by a data group 3 from the first buffer section 541, etc., followed by a data group (N) that is distributed from the third storage buffer 533 to the third buffer section 543. Additionally, the DMA controller 530 may also provide the fourth data (e.g., (N+1)-(M−1) groups of data) from the fourth storage buffer 534 to the fourth buffer section 544 to store a fourth representation of a fourth codeword at the fourth buffer section 544, where M is an integer having a value determined based on an amount of data included in the regions 511-514 divided by the interleave size. After the 0-(M−1) groups of data are provided from the DMA controller 530 to the buffer 540, the first buffer section 541 may store the first representation of the first codeword, the second buffer section 542 may store the second representation of the second codeword, the third buffer section 543 may store the third representation of the third codeword, and the fourth buffer section 544 may store the fourth representation of the fourth codeword.

The buffer 540 may provide the first representation, the second representation, the third representation, and/or the fourth representation to a decoder (not shown). For example, the decoder may include or correspond to the ECC engine 188 of FIG. 1. The decoder may be coupled to the DMA controller 530 via the buffer 540. The decoder may be configured to receive one or more codewords (e.g., representations of one or more codewords, such as the first representation and/or the second representation) from the DMA controller 530. The decoder may be configured to decode each representation of a codeword and to output data corresponding to the representation, such as data responsive to the request to perform the read operation.

By applying the one or more parameters 522, the DMA controller 530 may generate representations of the first codeword, the second codeword, and the third codeword based on data stored at the regions 511-513. To enable the DMA controller 530 to generate the first representation, the second representation, and the third representation, the DMA controller 530 may include the multiple storage buffers 531-534 that are distinct from the buffer 540. Accordingly, the DMA controller 530 may perform a burst read operation to read the data from the memory 504 into the multiple storage buffers 531-534 (that are internal to the DMA controller).

Figure 7:
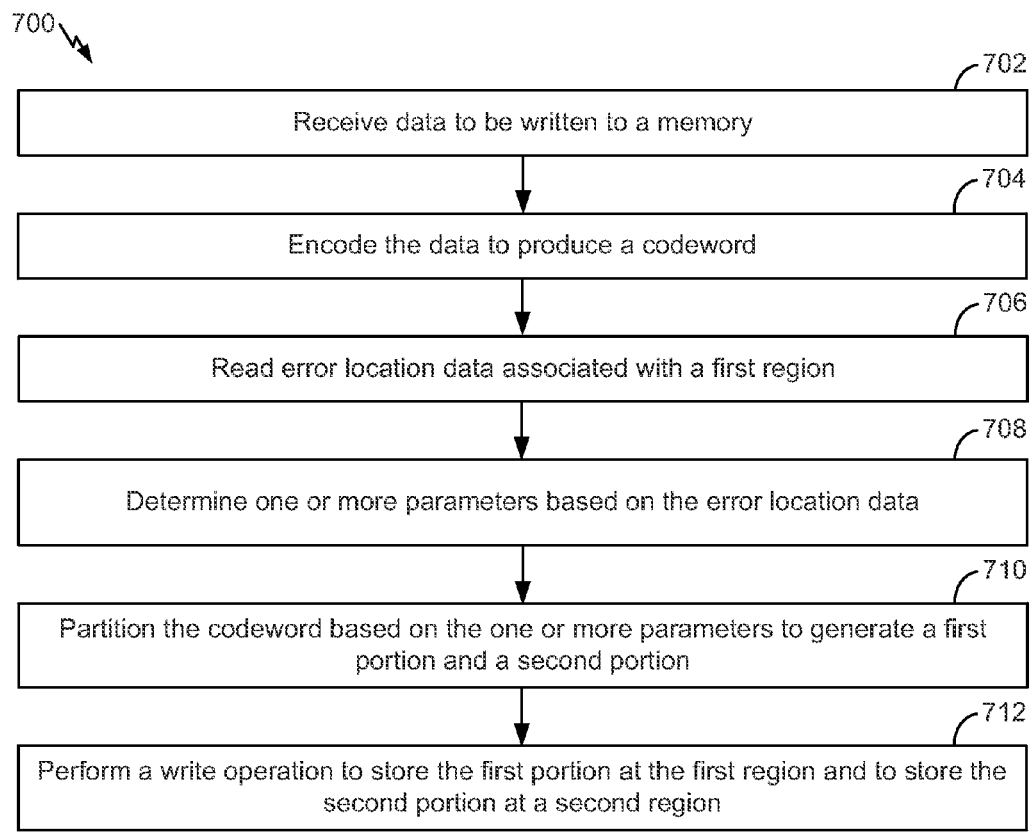
FIG. 7 is a flow diagram that illustrates a particular example of a method of operation of the data storage device of FIG. 1.

Referring to FIG. 7, a particular illustrative embodiment of a method is depicted and generally designated 700. The method 700 may be performed at a data storage device, such as the data storage device 102 of FIG. 1. For example, the method 700 may be performed by the data storage device 102, such as by the parameter engine 190, the controller 120, the data organizer 186, a processor or circuitry configured to execute firmware, or a combination thereof, as illustrative, non-limiting examples.

The method 700 includes receiving data to be written to a memory, at 702, and encoding the data to produce a codeword, at 704. The data storage device may receive the data from a host device that is coupled to the data storage device, such as the data 132 received from the host device 150 of FIG. 1. The data may be encoded by an encoder, such as the ECC engine 188 of FIG. 1. The data storage device may include a memory that has multiple regions, such as the first region and a second region. The memory may include or correspond to the memory 104 of FIG. 1, the memory 304 of FIG. 3, the memory 404 of FIG. 4, and/or the memory 504 of FIG. 5. In some implementations, the first region includes a first page of the memory and the second region includes a second page of the memory. The first page may be positioned adjacent to the second page in the memory. The codeword may include or correspond to the first encoded data 122, the second encoded data 124 of FIG. 1, or one of the codewords 550 of FIG. 5.

The method 700 includes reading error location data associated with a first region, at 706. The error location data may include or correspond to the error location data 172 of FIG. 1. In some implementations, the error location data may be read from the memory and may include faulty column data.

The method 700 also includes determining one or more parameters based on the error location data, at 708. For example, one or more parameters may be generated by the parameter engine 190. The one or more parameters may include or correspond to the parameters 180 (e.g., the first set of parameters 182 or the second set of parameters 184) of FIG. 1, the parameters 380 of FIG. 3, or the one or more parameters 522 of FIG. 5.

The method 700 further includes partitioning the codeword based on the one or more parameters to generate a first portion and a second portion, at 710, and performing a write operation to store the first portion at the first region and to store the second portion at the second region. For example, the first portion and the second portion may include or correspond to the first portion 152 and the second portion 154 of FIG. 1, respectively. As another example, the first portion and the second portion may include or correspond to the third portion 156 and the fourth portion 158 of FIG. 1, respectively. The codeword may be partitioned by the data organizer 186 of FIG. 1 or the DMA controller 530 of FIG. 5. In some implementations, the write operation may include multiple write operations, such as a first write oration to write the first portion to the first region and a second write operation to write the second portion to the second region.

In some implementations, after reading the error location data, a first number of faulty locations associated with a first section of the first region may be determined Additionally, a second number of faulty locations associated with a second section of the second region may be determined. The first number of faulty locations and the second number of faulty locations may be added together to determine a total number of faulty locations of the first section and the second section. The total number of faulty locations may be compared to a threshold, such as the threshold 176 of FIG. 1. The one or more parameters, such as the first set of parameters 182, the second set of parameters 184 of FIG. 1, the parameters 380 of FIG. 3, or the one or more parameters 522 of FIG. 5, may be generated in response to the total number of faulty locations being less than the threshold.

In some implementations, prior to partitioning the codeword, a write request, such as the request 134 of FIG. 1, may be received to write the data to the memory. The write request may include the data. Encoding the data may include producing a first codeword and a second codeword. The second codeword may be partitioned based on the one or more parameters to generate a third portion and a fourth portion. Execution of the write operation may store the first portion and the third portion at the first region and may store the second portion and the fourth portion at the second region.

In some implementations, the one or more parameters include a first indicator associated with a first size associated with the first portion, a second indicator associated with a second size associated with the second portion, a third indicator associated with a number of regions to be used to store the codeword, a first identifier of the first region, a second identifier of the second region, or a combination thereof. Additionally or alternatively, the one or more parameters may include an indicator associated with a number of codewords to store data at the first region, another indicator associated with an amount of data corresponding to each codeword to be stored at the first region, or a combination thereof. When the first region includes a first set of error locations, such as a set of error locations indicated by the error location data 172 of FIG. 1, the one or more parameters may be applied to the first codeword and to the second codeword during an interleave operation to map a first portion of the first codeword to a first subset of the set of error locations (of the first region) and to map a second portion of the second codeword to a second subset of the set of error locations (of the first region).

By generating the one or more parameters to be used to partition the codeword, different portions of the codeword may be stored at different regions. By storing the different portion at the different regions, a particular region considered to be unreliable may be used by the data storage device rather than being indicated as faulty (e.g., unreliable). By utilizing regions that would otherwise be identified as unreliable, a storage capacity of the memory of the data storage device and a life of the memory may be increased.

Figure 8:
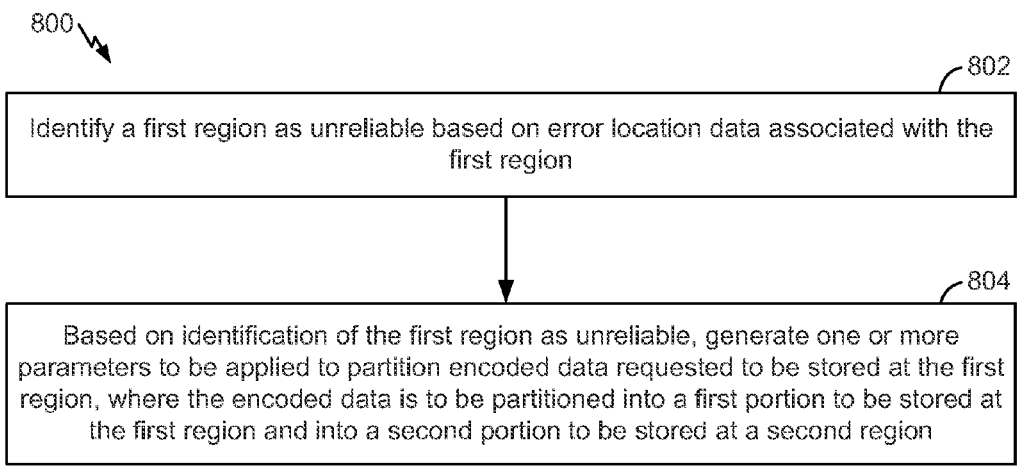
FIG. 8 is a flow diagram that illustrates another particular example of a method of operation of the data storage device of FIG. 1.

Referring to FIG. 8, a particular illustrative embodiment of a method is depicted and generally designated 800. The method 800 may be performed at a data storage device. For example, the method 800 may be performed by the data storage device 102, such as by the parameter engine 190, the controller 120, the data organizer 186, a processor or circuitry configured to execute firmware, or a combination thereof, as illustrative, non-limiting examples.

The method 800 includes identifying a first region as unreliable based on error location data associated with the first region, at 802. For example, the error location data may include or correspond to the error location data 172 of FIG. 1. The data storage device may include a memory that has multiple regions, such as the first region and a second region. The memory may include or correspond to the memory 104 of FIG. 1, the memory 304 of FIG. 3, the memory 404 of FIG. 4, or the memory 504 of FIG. 5. The memory may include a three-dimensional (3D) memory configuration that is monolithically formed in one or more physical levels of arrays of memory cells having an active area disposed above a silicon substrate and may include circuitry associated with operation of the memory cells (e.g., storage elements). Each region of the multiple regions may correspond to a physical page of the memory. In some implementations, the first region may be positioned adjacent to the second region in the memory.

The method 800 also includes, based on identification of the first region as unreliable, generating one or more parameters to be applied to partition encoded data requested to be stored at the first region, where the encoded data is to be partitioned into a first portion to be stored at the first region and into a second portion to be stored at a second region, at 804. After generating the one or more parameters, the one or more parameters may be stored at the memory. In some implementations, the one or more parameters are to be applied to partition second encoded data requested to be stored at the second region of the memory. For example, the second encoded data may be partitioned into a third portion to be stored at the first region and into a fourth portion to be stored at the second region. For example, the codeword and the second codeword may include or correspond to the first encoded data 122 and the second encoded data 124 of FIG. 1, respectively.

In some implementations, the error location data indicates a number of faulty columns corresponding to the first region and the error location data may be accessed from the memory responsive to a power-up operation. To determine whether the first region is unreliable, the number of faulty columns corresponding to the first region may be compared to a threshold, such as the threshold 176 of FIG. 1. For example, a value of the threshold is less than a number of bits associated with a correction capability of a decoder, such as the ECC engine 188 of FIG. 1 of the data storage device 102. If the number of faulty columns is greater than or equal to the threshold, the first region may be identified as unreliable and the one or more parameters may be generated.

In some implementations, the data storage device may receive a write request to write data to an address of the memory that corresponds to the first region. The codeword may be generated by an encoder, such as the ECC engine 188 of FIG. 1, based on the data and the codeword may be intended to be stored at the address. In response to the write request, the one or more parameters may be accessed based on the address. For example, the one or more parameters may be indexed using the address and the controller may use the address to access one or more parameters from a particular memory, such as the memory 104 or the memory 170 of FIG. 1. A first indicator and a second indicator included in the one or more parameters may be identified. The first indicator may indicate a first size of the first portion and the second indicator may indicate a second size of the second portion. The codeword may be partitioned based on the one or more parameters to generate the first portion of the codeword and the second portion of the codeword. In some implementations, partitioning the encoded data may include identifying a first group of bits of the encoded data based on the first size of the encoded data indicated by the first indicator and identifying a second group of bits of the encoded data based on the second size of the encoded data indicated by the first indicator. The first group of bits may be stored at a first buffer location and the second group of bits may be stored at a second buffer location that is distinct from the first buffer location. The first portion of the codeword may be stored at the first region and storing the second portion of the codeword may be at the second region.

The data storage device 102 may receive a read request to read data from the first region of the memory (e.g., to read data from an address associated with the first region). Responsive to the read request, the data storage device may access the one or more parameters based on the address. The data storage device may read first data (associated with the first portion of the codeword) from the first region and second data (associated with the second portion of the codeword) from the second region. For example, the data storage device may use the one or more parameters to identify the first data that corresponds to the first portion and to identify the second data that corresponds to the second portion and may combine the first data and the second data based on the one or more parameters to generate combined data. The combined data may be provided to a decoder of the data storage device. For example, the decoder may include error correction code (ECC) circuitry, such as the ECC engine 188 of FIG. 1, configured to decode the combined data.

In some implementations, the first region and the second region may be included in the same wordline of the memory. Additionally or alternatively, the first region may be included in a first plane of a die of the memory and the second region may be included in a second plane of the die. Additionally or alternatively, the first region is included in a first die of the memory and the second region may be included in a second die of the memory.

By generating the one or more parameters to write multiple codewords and to read multiple codewords from different regions, a particular region considered to be unreliable may be used rather than being identified as faulty (e.g., unusable to store data). By utilizing regions that would otherwise be identified as faulty, a storage capacity of the memory of the data storage device and a life of the memory may be increased.

Figure 9:
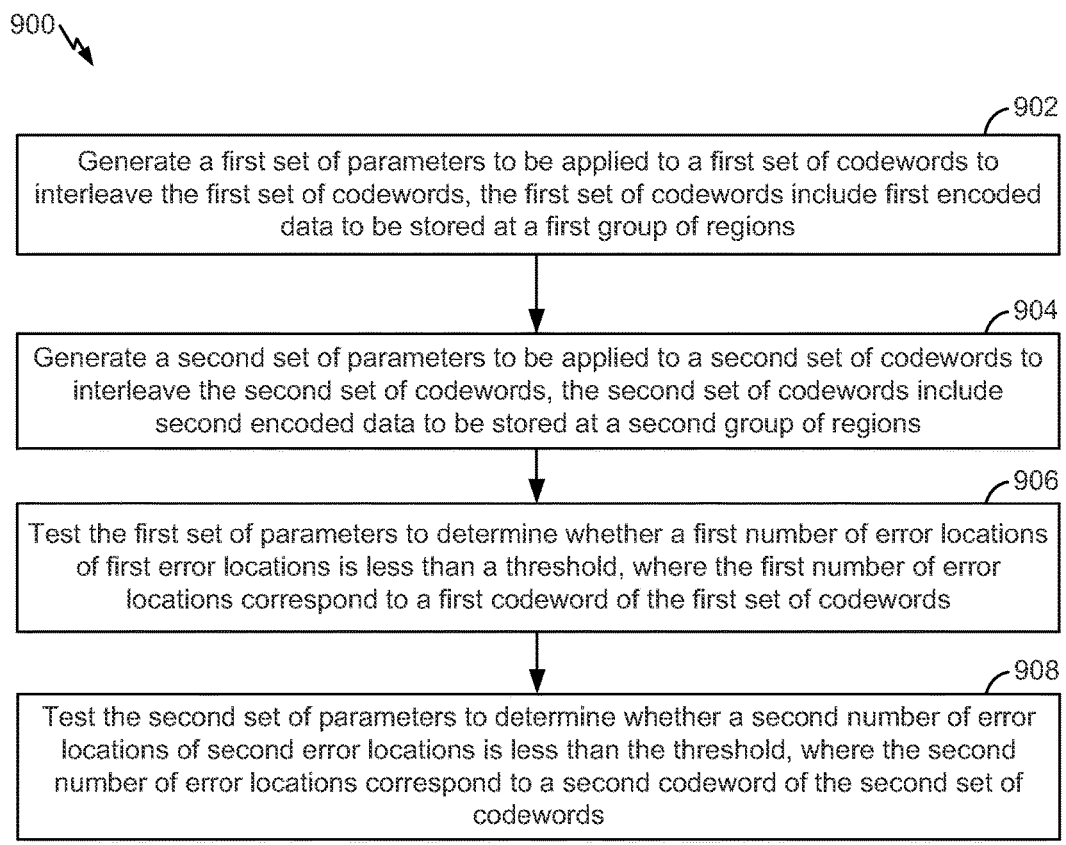
FIG. 9 is a flow diagram that illustrates another particular example of a method of operation of the data storage device of FIG. 1.

Referring to FIG. 9, a particular illustrative embodiment of a method is depicted and generally designated 900. The method 900 may be performed at the data storage device 102, such as by the data organizer 186, the parameter engine 190, the controller 120, a processor or circuitry configured to execute firmware, or a combination thereof, as illustrative, non-limiting examples.

The method 900 includes generating, at 902, a first set of parameters to be applied to a first set of codewords to interleave the first set of codewords. The first set of codewords include first encoded data to be stored at the first group of regions. For example, the first set of parameters may include or correspond to the first set of parameters 182 of FIG. 1. The data storage device may include a memory that has multiple regions. The memory may include or correspond to the memory 104 of FIG. 1, the memory 304 of FIG. 3, the memory 404 of FIG. 4, or the memory 504 of FIG. 5. The multiple regions may include a first group of regions and a second group of regions.

The method 900 also includes generating, at 902, a second set of parameters to be applied to a second set of codewords to interleave the second set of codewords. The second set of codewords include second encoded data to be stored at the second group of regions, at 904. For example, the second set of parameters may include or correspond to the second set of parameters 184 of FIG. 1. The first set of parameters may be different than the second set of parameters. In some implementations, the first group of regions is included in a first block of the memory and the second group of regions is included in a second block of the memory that is distinct from the first block. For example, with reference to FIG. 3, the first group of regions may be included in the first block 321 of the memory 304 and the second group of regions may be included in the second block 322 of the memory 304.

The method 900 includes testing the first set of parameters to determine whether a first number of error locations of the first error locations is less than a threshold, where the first number of error locations corresponds to a first codeword of the first set of codewords, at 906. In some implementations, the first set of parameters may be stored in response to a first determination that the first number of error locations is less than the threshold, such as the threshold 176 of FIG. 1. To illustrate, the first set of parameters may be stored in a particular memory, such as the memory 104 or the memory 170 of FIG. 1. In response to a determination that the first number of error locations is not less than the threshold, a third set of parameters may be generated to be applied to the first set of codewords to interleave the first set of codewords.

The method 900 further includes testing the second set of parameters to determine whether a second number of error locations of the second error locations is less than the threshold, where the second number of error locations corresponds to a second codeword of the second set of codewords, at 908. In some implementations, the second set of parameters may be stored in response to a second determination that the second number of error locations is less than the threshold. To illustrate, the second set of parameters may be stored in a particular memory, such as the memory 104 or the memory 170 of FIG. 1.

By generating the first set of parameters and the second set of parameters, regions of the memory otherwise considered unreliable may be used by the data storage device rather than being indicated as faulty (e.g., unreliable). By utilizing regions that would otherwise be identified as unreliable, a storage capacity of the memory of the data storage device and a life of the memory may be increased.

The method 700 of FIG. 7, the method 800 of FIG. 8, and/or the method 900 of FIG. 9 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 700 of FIG. 7, the method 800 of FIG. 8, and/or the method 900 of FIG. 9 can be initiated or controlled by one or more processors, such as one or more processors included in or coupled to a controller or a memory of the data storage device 102 and/or the host device 150 of FIG. 1. A controller configured to perform the method 700 of FIG. 7, the method 800 of FIG. 8, and/or the method 900 of FIG. 9 may be able to generate and apply storage parameters for a storage device.

Although various components of the data storage device 102 and/or the host device 150 of FIG. 1 are depicted herein as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 700 of FIG. 7, the method 800 of FIG. 8, and/or the method 900 of FIG. 9. In a particular implementation, each of the controller 120, the memory 104, the memory 170, and/or the host 150 of FIG. 1 includes a processor executing instructions that are stored at a memory, such as a non-volatile memory of the data storage device 102 or the host device 150 of FIG. 1. Alternatively or additionally, executable instructions that are executed by the processor may be stored at a separate memory location that is not part of the non-volatile memory, such as at a read-only memory (ROM) of the data storage device 102 or the host device 150 of FIG. 1.

With reference to FIG. 1, the data storage device 102 may be attached to or embedded within one or more host devices, such as within a housing of a host communication device (e.g., the host device 150). For example, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory. However, in other embodiments, the data storage device 102 may be implemented in a portable device configured to be selectively coupled to one or more external host devices. In still other embodiments, the data storage device 102 may be a component (e.g., a solid-state drive (SSD)) of a network accessible data storage system, such as an enterprise data system, a network-attached storage system, a cloud data storage system, etc.

To further illustrate, the data storage device 102 may be configured to be coupled to the host device 150 as embedded memory, such as in connection with an embedded Multi-Media Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In yet another particular embodiment, the data storage device 102 is coupled to the host device 150 (e.g., an accessing device) indirectly, e.g., via a network. For example, the data storage device 102 may be a network-attached storage (NAS) device or a component (e.g. a solid-state drive (SSD) device) of a data center storage system, an enterprise storage system, or a storage area network.

The memory 104, the memory 170 of FIG. 1, the memory 304 of FIG. 3, the memory 404 of FIG. 4, and/or the memory 504 of FIG. 5 may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104, the memory 170 of FIG. 1, the memory 304 of FIG. 3, the memory 404 of FIG. 4, and/or the memory 504 of FIG. 5 may include another type of memory. The memory 104, the memory 170 of FIG. 1, the memory 304 of FIG. 3, the memory 404 of FIG. 4, and/or the memory 504 of FIG. 5 may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
at a data storage device including a controller and a memory, the memory including a
first region and a second region, performing:
receiving data to be written to the memory;
encoding the data to produce a codeword;
reading error location data associated with the first region;
generating one or more parameters based on the error location data;
partitioning, by the controller, the codeword based on the one or more parameters to generate a first portion and a second portion; and
performing a write operation to:
store the first portion at the first region; and
store the second portion at the second region.

2. The method of claim 1, further comprising:
prior to partitioning the codeword, receiving a write request to write the data to the memory, wherein:
the write request includes the data; and
encoding the data includes producing a second codeword;
partitioning the second codeword based on the one or more parameters to generate a third portion and a fourth portion; and
executing the write operation to:
store the first portion and the third portion at the first region; and
store the second portion and the fourth portion at the second region.

3. The method of claim 2, wherein the one or more parameters include a first indicator associated with a first size associated with the first portion, a second indicator associated with a second size associated with the second portion, a third indicator associated with a number of regions to be used to store the codeword, a first identifier of the first region, a second identifier of the second region, or a combination thereof.

4. The method of claim 1, wherein:
the first region includes a first page of the memory and the second region includes a second page of the memory; and
the first page is positioned adjacent to the second page in the memory.

5. The method of claim 1, further comprising:
after reading the error location data, determining a first number of faulty locations associated with a first section of the first region;
determining a second number of faulty locations associated with a second section of the second region;
adding the first number of faulty locations and the second number of faulty locations to determine a total number of faulty locations; and
comparing the total number of faulty locations to a threshold, wherein the one or more parameters are generated in response to the total number of faulty locations being less than the threshold.

6. The method of claim 5, wherein the error location data:
is read from the memory; and
includes faulty column data.

7. The method of claim 1, wherein the one or more parameters include a first indicator associated with a number of codewords to store data at the first region, a second indicator associated with an amount of data corresponding to each codeword to be stored at the first region, or a combination thereof.

8. An apparatus comprising:
means for identifying a first region of multiple regions of a memory as unreliable based on error location data associated with the first region, wherein the multiple regions include the first region and a second region;
means for generating, based on identification of the first region as unreliable, at least one parameter; and
means for partitioning, based on the at least one parameter, encoded data into:
a first portion to be stored at the first region; and
a second portion to be stored at the second region.

9. The apparatus of claim 8, further comprising:
means for accessing the error location data from the memory responsive to a power-up operation, wherein the error location data indicates a number of faulty columns corresponding to the first region; and
means for comparing the number of faulty columns to a threshold, wherein the first region is identified as unreliable based on the number of faulty columns being greater than or equal to the threshold.

10. The apparatus of claim 9, further comprising means for partitioning, based on the at least one parameter, second encoded data into:

a third portion to be stored at the first region; and
a fourth portion to be stored at the second region.

11. The apparatus of claim 8, wherein:
each region of the multiple regions corresponds to a physical page of the memory;
the first region is positioned adjacent to the second region in the memory; and
a first size of the first portion of the encoded data is different than a second size of the second portion of the encoded data.

12. The method of claim 3, further comprising:
identifying the first indicator included in the one or more parameters, the first indicator indicating a first size of the first portion; and
identifying the second indicator included in the one or more parameters, the second indicator indicating a second size of the second portion,
wherein partitioning the codeword further includes:
 identifying a first group of bits of the codeword based on the first size indicated by the first indicator;
 identifying a second group of bits of the codeword based on the second size indicated by the second indicator;
 storing the first group of bits at a first buffer location; and
 storing the second group of bits at a second buffer location that is distinct from the first buffer location.

13. The apparatus of claim 8, further comprising:
means for receiving a read request to read data from the first region of the memory, wherein the first region is associated with an address; and
means for accessing, responsive to the read request, the one or more parameters based on the address.

14. The apparatus of claim 13, further comprising:
means for reading first data from the first region and second data from the second region, wherein:
the first data corresponds to the first portion of the encoded data; and
the second data corresponds to the second portion of the encoded data;
means for combining the first data and the second data to generate combined data; and
means for decoding the combined data.

15. The apparatus of claim 8, wherein the first region and the second region are included in the same wordline of the memory.

16. The apparatus of claim 8, wherein:
the first region is included in a first plane of a die of the memory; and
the second region is included in a second plane of the die.

17. The apparatus of claim 8, wherein:
the first region is included in a first die of the memory; and
the second region is included in a second die of the memory.

18. A data storage device comprising:
a memory including a wordline that includes a first region and a second region;
an encoder configured to:
 receive data to be stored at the memory; and
 encode the data to produce a first codeword and a second codeword;
a buffer including a first buffer section and a second buffer section, wherein:
 the first buffer section is configured to store the first codeword associated with the first region; and
 the second buffer section is configured to store the second codeword associated with the second region; and
a direct memory access (DMA) controller coupled to the memory and to the buffer,
wherein the DMA controller is configured to:
 receive one or more parameters associated with a write operation, the one or more parameters based on error location information of the first region;
 interleave the first codeword and the second codeword based on the one or more parameters to generate first write data and second write data; and
 initiate the write operation to: program the first write data at the first region; and
 program the second write data at the second region.

19. The data storage device of claim 18, wherein:
the error location information identifies a set of error locations that correspond to the first region;
the one or more parameters are generated in response to a number of error locations in the set of error locations being greater than a threshold; and
the first write data stored at the first region includes:
 a first portion of the first codeword stored at a first subset of error locations of the set of error locations; and
 a second portion of the second codeword stored at a second subset of error locations of the set of error locations.

20. The data storage device of claim 19, wherein the one or more parameters are applied to the first codeword and to the second codeword during an interleave operation to:
map a first portion of the first codeword to a first subset of the set of error locations; and
map a second portion of the second codeword to a second subset of the set of error locations.

21. The data storage device of claim 18, wherein the one or more parameters indicate a number of codewords to be interleaved, a first number of bits of the first codeword to be used to generate the first write data, a second number of bits of the second codeword to be used to generate the first write data, or a combination thereof.

22. The data storage device of claim 18, wherein one or more parameters include a first indicator that identifies the first region, a second indicator that identifies the second region, a third indicator of a number of codewords, a fourth indicator that indicates an amount of data from each of the first codeword and the second codeword to be interleaved, or a combination thereof.

23. The data storage device of claim 18, wherein the one or more parameters are applied to the first codeword and to the second codeword to:
map first data from the first codeword to the first region; and
to map second data from the second codeword to the first region.

24. The data storage device of claim 18, wherein the one or more parameters are applied during an interleave operation to interleave the first codeword and the second codeword to partition the first codeword into:
a first portion of data included in the first write data; and
a second portion of data included in the second write data.

25. The data storage device of claim 18, wherein:
the DMA controller includes multiple storage buffers; and
the DMA controller is further configured to:
 access the first codeword from the first buffer section;
 access the second codeword from the second buffer section;

interleave the first codeword and the second codeword to:
generate the first write data at a first storage buffer of the multiple storage buffers; and
generate the second write data at a second storage buffer of the multiple storage buffers prior to initiating the write operation; and
perform a burst write operation to write the first write data and the second write data to the memory.

26. The data storage device of claim 18, wherein the memory includes:
a three-dimensional (3D) memory configuration that is monolithically formed in one or more physical levels of arrays of memory cells having an active area disposed above a silicon substrate; and
circuitry associated with operation of the memory cells.

27. A data storage device comprising:
a memory including a wordline that includes a first region and a second region; and
a direct memory access (DMA) controller coupled to the memory, wherein the DMA controller is configured to:
receive one or more parameters associated with a read operation to read first data from the first region and second data from the second region, wherein the one or more parameters indicate a number of interleaved codewords;
perform a burst read operation to read a portion of the memory that includes the first data and the second data; and
de-interleave the first data and the second data based on the one or more parameters to generate a first codeword and a second codeword.

28. The data storage device of claim 27, wherein:
the portion of the memory includes the wordline,
the first region includes a first physical page of the wordline, and
the second region includes a second physical page of the wordline.

29. The data storage device of claim 27, further comprising a decoder coupled to the DMA controller, wherein:
the decoder is configured to receive the first codeword and the second codeword from the DMA controller;
the first codeword corresponds to the first region; and
the second codeword corresponds to the second region.

30. The data storage device of claim 27, further comprising a buffer including a first buffer section and a second buffer section, wherein:
the first buffer section is configured to store the first codeword;
the second buffer section is configured to store the second codeword; and
to de-interleave the first data and the second data, the DMA controller is further configured to:
provide a first group of bits of the first data to the first buffer section; and
provide a second group of bits of the first data to the second buffer section.

31. A method comprising:
at a data storage device including a memory, the memory including multiple regions, wherein the multiple regions include a first group of regions and a second group of regions, the first group of regions including first error locations and the second group of region including second error locations, performing:
generating a first set of parameters to be applied to a first set of codewords to interleave the first set of codewords, the first set of codewords include first encoded data to be stored at the first group of regions;
generating a second set of parameters to be applied to a second set of codewords to interleave the second set of codewords, the second set of codewords include second encoded data to be stored at the second group of regions;
testing the first set of parameters to determine whether a first number of error locations of the first error locations is less than a threshold, wherein the first number of error locations corresponds to a first codeword of the first set of codewords; and
testing the second set of parameters to determine whether a second number of error location of the second error locations is less than the threshold, wherein the second number of error locations corresponds to a second codeword of the second set of codewords.

32. The method of claim 31, wherein:
the first group of regions is included in a first block of the memory;
the second group of regions is included in a second block of the memory that is distinct from the first block; and
the first set of parameters is different from the second set of parameters.

33. The method of claim 31, further comprising:
storing the first set of parameters in response to a first determination that the first number of error locations is less than the threshold; and
storing the second set of parameters in response to a second determination that the second number of error locations is less than the threshold.

34. The method of claim 31, further comprising, in response to a determination that the first number of error locations is not less than the threshold, generating a third set of parameters to be applied to the first set of codewords to interleave the first set of codewords.

* * * * *